US009190979B2

(12) United States Patent
Granger-Jones et al.

(10) Patent No.: US 9,190,979 B2
(45) Date of Patent: Nov. 17, 2015

(54) HYBRID COUPLER

(71) Applicant: RF Micro Devices, Inc., Greensboro, NC (US)

(72) Inventors: Marcus Granger-Jones, Scotts Valley, CA (US); Michael F. Zybura, Scotts Valley, CA (US); Ruediger Bauder, Feldkirchen-Westerham (DE)

(73) Assignee: RF Micro Devices, Inc., Greensboro, NC (US)

( * ) Notice: Subject to any disclaimer, the term of this patent is extended or adjusted under 35 U.S.C. 154(b) by 116 days.

(21) Appl. No.: 13/925,891

(22) Filed: Jun. 25, 2013

(65) Prior Publication Data

US 2013/0285763 A1    Oct. 31, 2013

Related U.S. Application Data

(63) Continuation-in-part of application No. 13/760,240, filed on Feb. 6, 2013.

(60) Provisional application No. 61/663,818, filed on Jun. 25, 2012, provisional application No. 61/595,795, filed on Feb. 7, 2012.

(51) Int. Cl.
| | |
|---|---|
| *H01P 5/18* | (2006.01) |
| *H03H 7/48* | (2006.01) |
| *H04L 5/14* | (2006.01) |
| *H01P 5/12* | (2006.01) |
| *H03H 1/00* | (2006.01) |
| *H04L 25/02* | (2006.01) |

(52) U.S. Cl.
CPC .................. *H03H 7/48* (2013.01); *H04L 5/143* (2013.01); *H03H 2001/0085* (2013.01); *H03H 2001/0092* (2013.01); *H04L 25/0278* (2013.01)

(58) Field of Classification Search
CPC ...................................... H01P 5/18; H01P 5/04
USPC .................................. 333/109–112, 116–118
See application file for complete search history.

(56) References Cited

U.S. PATENT DOCUMENTS 3,593,208 A * 7/1971 Smith ........................... 333/112
4,216,446 A * 8/1980 Iwer .............................. 333/112
(Continued)

OTHER PUBLICATIONS

Non-Final Office Action for U.S. Appl. No. 13/633,459, mailed Jun. 26, 2014, 28 pages.

(Continued)

*Primary Examiner* — Dean Takaoka
(74) *Attorney, Agent, or Firm* — Withrow & Terranova, P.L.L.C.

(57) ABSTRACT

This disclosure relates to hybrid couplers for radio frequency (RF) signals. The hybrid coupler includes a first port, a second port, a third port, a fourth port, a first inductive element connected from the first port to the third port, and a second inductive element connected from the second port to the fourth port. The hybrid coupler further includes a first capacitive element and a second capacitive element. The first capacitive element is connected between an intermediary node of the first inductive element and either the first port or the third port, while the second capacitive element is coupled between an intermediary node of the second inductive element and either the second port or the fourth port. Accordingly, the first capacitive element and a portion of the first inductive element and the second capacitive element and a portion of the second capacitive element each form a harmonic trap.

20 Claims, 14 Drawing Sheets

(56) References Cited

U.S. PATENT DOCUMENTS

| | | | |
|---|---|---|---|
| 5,180,999 | A | 1/1993 | Edwards |
| 6,484,012 | B1 | 11/2002 | Nche et al. |
| 6,924,715 | B2 | 8/2005 | Beaudin et al. |
| 7,394,333 | B2 * | 7/2008 | Ezzeddine et al. ............ 333/109 |
| 7,741,929 | B2 * | 6/2010 | Hash ............................ 333/116 |
| 7,821,355 | B2 | 10/2010 | Engel |
| 7,863,998 | B2 * | 1/2011 | Rofougaran .................... 333/25 |
| 8,243,855 | B2 | 8/2012 | Zarei |
| 8,718,582 | B2 | 5/2014 | See et al. |
| 2002/0136193 | A1 | 9/2002 | Chang et al. |
| 2004/0008082 | A1 | 1/2004 | Dow |
| 2004/0127172 | A1 | 7/2004 | Gierkink et al. |
| 2006/0071714 | A1 | 4/2006 | Ramaswamy et al. |
| 2007/0207748 | A1 | 9/2007 | Toncich |
| 2008/0219389 | A1 | 9/2008 | Nisbet |
| 2008/0290947 | A1 | 11/2008 | Dawe |
| 2009/0221259 | A1 | 9/2009 | Shiramizu et al. |
| 2009/0251618 | A1 | 10/2009 | Gao et al. |
| 2009/0279642 | A1 | 11/2009 | Zarei |
| 2011/0008042 | A1 | 1/2011 | Stewart |
| 2011/0043270 | A1 | 2/2011 | Kusuda |
| 2012/0119842 | A1 | 5/2012 | Gu et al. |
| 2012/0235735 | A1 | 9/2012 | Spits et al. |
| 2013/0028360 | A1 | 1/2013 | Rofougaran et al. |
| 2013/0083703 | A1 | 4/2013 | Granger-Jones et al. |
| 2013/0115998 | A1 | 5/2013 | Lamm et al. |
| 2013/0165067 | A1 | 6/2013 | DeVries et al. |
| 2013/0201882 | A1 * | 8/2013 | Bauder et al. ................. 370/277 |
| 2013/0273860 | A1 | 10/2013 | Pehlke |
| 2014/0192727 | A1 | 7/2014 | Liu et al. |
| 2014/0288723 | A1 | 9/2014 | Persson |

OTHER PUBLICATIONS

Non-Final Office Action for U.S. Appl. No. 13/760,159, mailed Aug. 14, 2014, 10 pages.
Non-Final Office Action for U.S. Appl. No. 13/760,201, mailed Aug. 28, 2014, 9 pages.
Non-Final Office Action for U.S. Appl. No. 13/760,240, mailed Aug. 27, 2014, 13 pages.
Andrews, David, "Chapter 5: Practical Design," Lumped Element Quadrature Hybrids, Copyright: 2006, pp. 129-135, Artech House, Inc., Norwood, Massachusetts.
Fisher, R.E., "Broad-Band Twisted-Wire Quadrature Hybrids," IEEE Transactions on Microwave Theory and Techniques, vol. 21, Issue 5, May 1973, pp. 355-357.
Monteath, G.D., "Coupled Transmission Lines as Symmetrical Directional Couplers," Proceedings of the IEE—Part B: Radio and Electronic Engineering, vol. 102, Issue 3, May 1955, pp. 383-392.
Vizmuller, Peter, "Chapter 2: Circuit Examples," RF Design Guide: Systems, Circuits, and Equations, Copyright: 1995, pp. 95-98, Artech House, Inc., Norwood, Massachusetts.
Zybura, Michael F. et al., "Combined Balun Transformer and Harmonic Filter," U.S. Appl. No. 61/555,311, filed Nov. 3, 2011, 9 pages.
Rizzi, Peter A., "Chapter 9: Some Filter and Resonator Applications," Microwave Engineering: Passive Circuits, Copyright: 1988, pp. 504-507, Prentice-Hall, Englewood Cliffs, New Jersey.
Wen, Jiguo et al., "Suppression of Reflection Coefficients of Surface Acoustic Wave Filters Using Quadrature Hybrids," IEEE Transactions on Ultrasonics, Ferroelectrics, and Frequency Control, vol. 53, No. 10, Oct. 2006, pp. 1912-1917.
Young, Leo et al., "A High Power Diplexing Filter," IRE Transactions on Microwave Theory and Techniques, Jul. 1959, pp. 384-387.
Andrews, David, "Chapter 4: Passive Synthesis," Lumped Element Quadrature Hybrids, Copyright: 2006, pp. 79-81, Artech House, Inc., Norwood, Massachusetts.
Final Office Action for U.S. Appl. No. 13/633,459, mailed Oct. 17, 2014, 23 pages.
Notice of Allowance for U.S. Appl. No. 13/633,459, mailed Jan. 13, 2015, 11 pages.
Notice of Allowance for U.S. Appl. No. 13/760,159, mailed Jan. 14, 2015, 6 pages.
Notice of Allowance for U.S. Appl. No. 13/760,201, mailed Feb. 27, 2015, 8 pages.
Notice of Allowance for U.S. Appl. No. 13/760,240, mailed Mar. 4, 2015, 8 pages.

* cited by examiner

US 9,190,979 B2

HYBRID COUPLER

RELATED APPLICATIONS

This application claims the benefit of provisional patent application Ser. No. 61/663,818, filed Jun. 25, 2012, the disclosure of which is hereby incorporated herein by reference in its entirety.

This application is a continuation-in-part of U.S. patent application Ser. No. 13/760,240, filed on Feb. 6, 2013 and entitled "TUNABLE HYBRID COUPLER," now U.S. Pat. No. 9,083,518, which claims the benefit of and priority to U.S. Provisional Patent Application Ser. No. 61/595,795, filed on Feb. 7, 2012 and entitled "TUNABLE DUPLEXER," the disclosures of which are hereby incorporated herein by reference in their entireties.

FIELD OF THE DISCLOSURE

The disclosure relates generally to hybrid couplers.

BACKGROUND

Hybrid couplers are used in many types of radio frequency (RF) circuits, such as duplexers, multiplexers, balanced amplifiers, transmit/receive switches, and/or the like. A hybrid coupler is a device that splits an RF signal into quadrature hybrid signals (QHSs). Unfortunately, hybrid couplers may have limited quality (Q) factors, thus passing undesired harmonics into the QHSs. As such, additional RF filters are often used to filter the undesired harmonics out of the QHSs. However, these additional RF filters introduce additional insertion losses.

Thus, designs for hybrid couplers that are capable of filtering out undesired harmonics from the QHSs are needed.

SUMMARY

This disclosure relates to hybrid couplers for radio frequency (RF) signals. In one embodiment, a hybrid coupler includes a first port, a second port, a third port, a fourth port, a first inductive element connected from the first port to the third port, and a second inductive element connected from the second port to the fourth port. The first inductive element and the second inductive element are mutually coupled and are configured to split an RF signal into a first quadrature hybrid signal (QHS) and a second QHS. In addition, the hybrid coupler further includes a first capacitive element and a second capacitive element. The first capacitive element is connected between an intermediary node of the first inductive element and either the first port or the third port, while the second capacitive element is coupled between an intermediary node of the second inductive element and either the second port or the fourth port. Accordingly, the first capacitive element and a portion of the first inductive element and the second capacitive element and a portion of the second capacitive element each form a harmonic trap. In this manner, undesired harmonics may be filtered from the first QHS and the second QHS, thereby effectively raising a quality (Q) factor of the hybrid coupler.

Those skilled in the art will appreciate the scope of the present disclosure and realize additional aspects thereof after reading the following detailed description of the preferred embodiments in association with the accompanying drawing figures.

DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates one embodiment of a hybrid coupler that includes a first port, a second port, a third port, and a fourth port; a first inductive element connected from the first port to the third port; a second inductive element connected from the second port to the third port; a first capacitive element connected between the first port and an intermediary node of the first inductive element; and a second capacitive element connected between the second port and an intermediary node of the second inductive element.

FIG. 2 illustrates another embodiment of the hybrid coupler, wherein the hybrid coupler further includes a third capacitive element connected between the first port and the second port, and a fourth capacitive element connected between the third port and the fourth port.

FIG. 3 illustrates yet another embodiment of the hybrid coupler, wherein the hybrid coupler of FIG. 3 is like the hybrid coupler of FIG. 1, except that the first capacitive element is connected between the intermediary node of the first inductive element and the third port, and the second capacitive element is connected between the intermediary node of the second inductive element and the fourth port.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
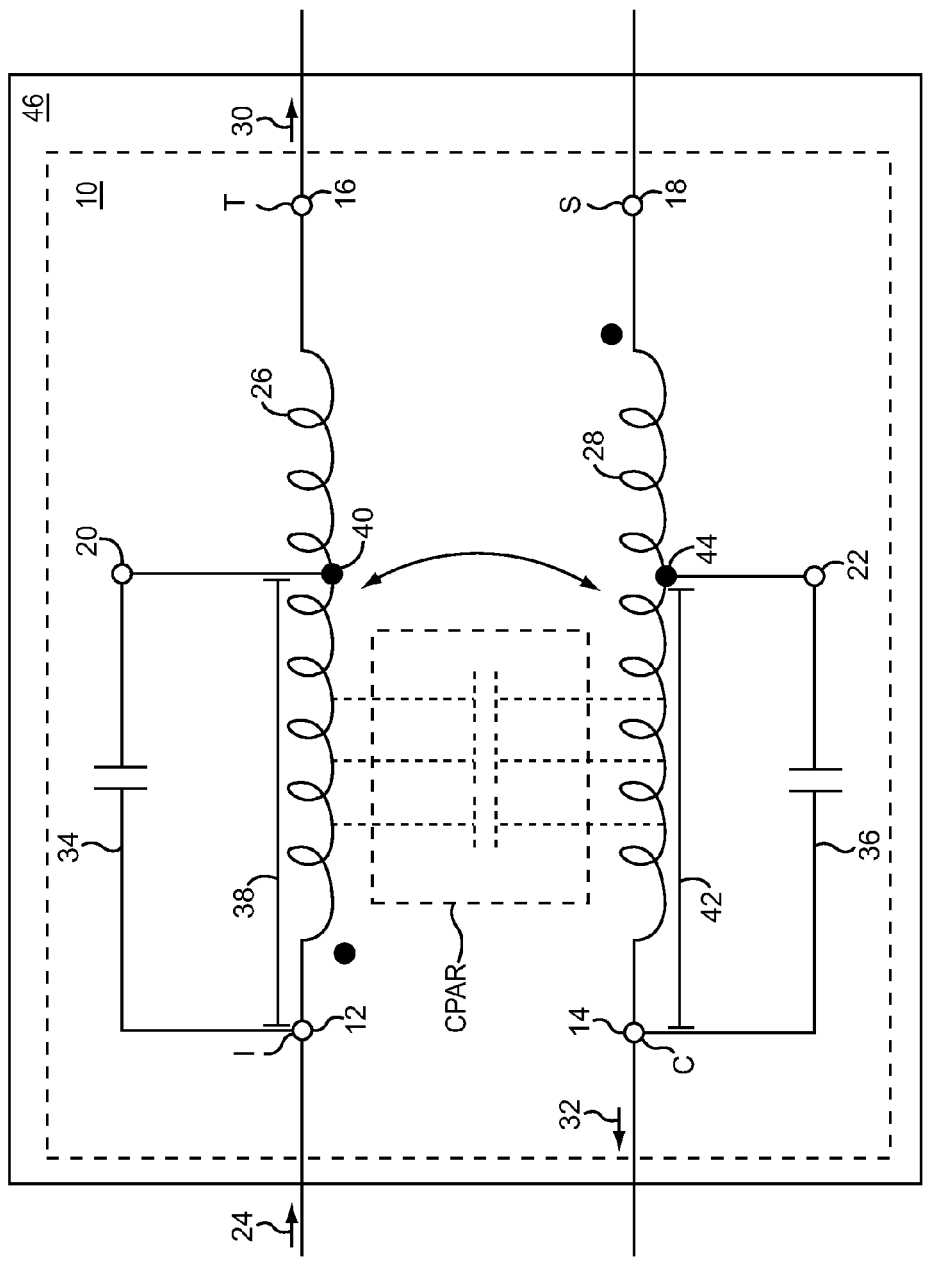

FIG. 1 illustrates one embodiment of a hybrid coupler 10 in accordance with this disclosure. The hybrid coupler 10 shown in FIG. 1 is a lumped-element hybrid coupler. However, the hybrid coupler 10 may be implemented using any suitable hybrid coupler topology. In alternative embodiments, the hybrid coupler 10 may be a transmission line coupler, a Wilkinson hybrid coupler, a stripline hybrid coupler, a microstrip hybrid coupler, a ferrite core hybrid coupler, amalgamations of different types of hybrid couplers, and/or the like. The hybrid coupler 10 has a first port 12, a second port 14, a third port 16, a fourth port 18, a fifth port 20, and a sixth port 22. Each of the ports 12, 14, 16, 18, 20, 22 may be a node, a terminal, a portion of a conductive structure, and/or the like. In this embodiment, the first port 12 of the hybrid coupler 10 is an input port I for receiving a radio frequency (RF) signal 24. Accordingly, if the hybrid coupler 10 were connected within an RF module, the first port 12 would be coupled to upstream RF circuitry. In this embodiment, the second port 14 is a coupled port C of the hybrid coupler 10, the third port 16 of the hybrid coupler 10 corresponds to a thru port T of the hybrid coupler 10, and the fourth port 18 of the hybrid coupler 10 corresponds to an isolation port S of the hybrid coupler 10.

The hybrid coupler 10 shown in FIG. 1 includes a first inductive element 26 and a second inductive element 28. The first inductive element 26 is connected in series between the first port 12 and the third port 16. The second inductive element 28 is connected in series between the second port 14 and the fourth port 18. In this embodiment, the first inductive element 26 and the second inductive element 28 are inductively coupled and have a coupling coefficient k that is equal to approximately one (1). As such, the first inductive element 26 is operable to generate a magnetic flux in response to a current propagating on the first inductive element 26. The magnetic flux generated by the first inductive element 26 also flows within the second inductive element 28. The magnetic flux thus induces an electromotive force on the second inductive element 28 so as to generate a current that propagates on the second inductive element 28. Since the coupling coefficient k between the first inductive element 26 and the second inductive element 28 is one (1), the currents propagating on the first inductive element 26 and the second inductive element 28 have approximately the same magnitude. In other words, half of the power (ignoring parasitic and non-ideal circuit behavior) is transferred through the magnetic flux from the first inductive element 26 and the second inductive element 28.

Similarly, the second inductive element 28 is operable to generate a magnetic flux in response to a current propagating on the second inductive element 28. The magnetic flux generated by the second inductive element 28 also flows within the first inductive element 26. The magnetic flux thus induces an electromotive force on the first inductive element 26 so as to generate a current that propagates on the first inductive element 26. Since the coupling coefficient k between the second inductive element 28 and the first inductive element 26 is one (1), the currents propagating on the second inductive element 28 and the first inductive element 26 have approximately the same magnitude. In other words, half of the power (ignoring parasitic and non-ideal circuit behavior) is transferred through the magnetic flux from the second inductive element 28 to the first inductive element 26. In this embodiment, the first inductive element 26 has a first inductance and the second inductive element 28 has a second inductance, wherein the first inductance and the second inductance are the same.

Accordingly, the hybrid coupler 10 is configured to split an RF signal received at one of the ports 12, 14, 16, 18 into a pair of RF quadrature hybrid signals (QHSs). One of the RF QHS generated from the splitting of the RF signal propagates through the inductive element 26, 28 in series with the port 12, 14, 16, 18 that received an RF signal. For example, in this embodiment, a first RF QHS 30 is generated from the third port 16 in response to the first port 12 receiving the RF signal 24. In this embodiment, the first RF QHS 30 output from the third port 16 is phase-aligned with the RF signal. However, in alternative embodiments, a phase shift of Δ (i.e., such as +45 degrees or +π/4 radians) may be provided from the first port 12 to the third port 16.

The other RF QHS generated from the splitting of the RF signal propagates through the other inductive element 28, 26 that is inductively coupled with the inductive element 26, 28. Each RF QHS has approximately half the spectral power density of the RF signal received at the port 12, 14, 16, 18. One RF QHS is output at the port 16, 18, 12, 14, connected to the other side of the inductive element 26, 28 on which the RF signal was received. The other RF QHS propagates on the other inductive element 28, 26 and, in this embodiment, in the opposite direction as the RF signal, as demonstrated by the mutual coupling dot for the hybrid coupler 10 illustrated in FIG. 1. As such, the other RF QHS is configured to be output at the port 14, 12, 18, 16 in response to receiving the RF signal at the port 12, 14, 16, 18.

For example, in this embodiment, a second RF QHS 32 is generated from the second port 14 in response to the RF signal 24 being received at the first port 12. The second RF QHS 32 output from the second port 14 has a phase of +90 degrees or +π/2 radians with respect to the RF signal 24. However, in alternative embodiments, a phase shift of Δ±90 degrees (such as +135 degrees or +π/4 radians, −45 degrees or −π/4 radians) may be provided from the port 12, 14, 16, 18 that receives the RF signal and the port 14, 12, 18, 16 that outputs the other RF QHS. Finally, note that that the first port 12 is isolated from the fourth port 18, since the fourth port 18 is unresponsive to the RF signal 24 at the first port 12. Alternatively, if the dot convention for the second inductive element 28 were on the opposite end from the end shown in FIG. 1, the fourth port 18 would be the coupled port and the second port 14 would be the isolated port when the RF signal 24 is received at the first port 12. The first RF QHS 30 and the second RF QHS 32 are quadrature hybrids, since there is approximately a 90-degree or π/2 radians phase difference between the signals. The RF signal 24 may be any type of suitable RF signal, such as an RF receive signal or an RF transmission signal, depending on the RF application for the hybrid coupler 10.

In the embodiment shown in FIG. 1, the first inductive element 26 and the second inductive element 28 are configured so that there is a parasitic capacitance CPAR between them. In this embodiment, the parasitic capacitance CPAR is a distributed across the first inductive element 26 and the second inductive element 28 and is defined by the characteristic capacitance between the first inductive element 26 and the second inductive element 28. The parasitic capacitance CPAR, along with the inductances of the first inductive element 26 and the second inductive element 28, define a frequency response with a passband with a first resonant frequency. As such, the parasitic capacitance CPAR sets a capacitance value for resonance with the first inductive element 26 and the second inductive element 28. This passband and resonance are set to the RF communication band of the RF signal 24, and thus the first RF QHS 30 and the second RF QHS 32 are also within the RF communication band of the RF signal 24. In order to have strong mutual coupling between the first inductive element 26 and the second inductive element 28, the first inductive element 26 and the second inductive element 28 may each have relatively large inductances with respect to the capacitance value of the parasitic capacitance CPAR.

Of course, non-ideal characteristics of the hybrid coupler 10, such as parasitic impedances, may result in the first RF QHS 30 and the second RF QHS 32 being slightly unbalanced with respect to one another, or having slightly less than half the power of the RF signal 24. Also, non-ideal characteristics can result in the phase difference between the first RF QHS 30 and the second RF QHS 32 fluctuating somewhat from a 90-degree or π/2 radians phase difference. These types of errors are acceptable so long as the first RF QHS 30 and the second RF QHS 32 comply with spectrum requirements for the RF communication band.

To increase the quality (Q) factor of the hybrid coupler 10, the hybrid coupler 10 includes a first capacitive element 34 and a second capacitive element 36. The first capacitive element 34 is connected in parallel with a portion 38 of the first inductive element 26. More specifically, the first capacitive element 34 of FIG. 1 is connected from the first port 12 to an intermediary node 40 of the first inductive element 26. As such, the first capacitive element 34 does not have to resonate with the entire first inductive element 26 to create a notch. Rather, the first capacitive element 34 is configured to create the notch by resonating with only the portion 38 of the first inductive element 26. Since the portion 38 of the first inductive element 26 has a smaller inductance than the entire first inductive element 26, the notch is created by the portion 38 of the first inductive element 26 and the first capacitive element 34. An inductance of the portion 38 of the first inductive element 26 and a capacitance of the first capacitive element 34 may be set so as to filter out undesired harmonics (such as a third harmonic) of the first RF QHS 30 from the RF signal 24.

Similarly, the second capacitive element 36 is connected in parallel with a portion 42 of the second inductive element 28. More specifically, the second capacitive element 36 is connected from the second port 14 to an intermediary node 44 of the second inductive element 28. As such, the second capacitive element 36 does not resonate with the entire second inductive element 28 to create a notch. Rather, the second capacitive element 36 is configured to create the notch by resonating with only the portion 42 of the second inductive element 28. Since the portion 42 of the second inductive element 28 has a smaller inductance than the entire second inductive element 28, the notch is placed at a resonant frequency defined by an inductance of the portion 42 of the second inductive element 28 and a capacitance value of the second capacitive element 36. An inductance of the portion 42 of the second inductive element 28 and a capacitance of the second capacitive element 36 may be set so as to filter out undesired harmonics (such as a third harmonic) of the second RF QHS 32 from the RF signal 24.

In this embodiment, the inductances of the portion 38 and the portion 42 are approximately the same and the capacitances of the first capacitive element 34 and the second capacitive element 36 are approximately the same. As such, a first parallel LC resonator formed by the portion 38 and the first capacitive element 34, and a second parallel LC resonator formed by the portion 42 and the second capacitive element 36 each resonate at approximately the same resonant frequency. Alternatively, the inductances of the portion 38 and the portion 42 may be different and/or the capacitances of the first capacitive element 34 and the second capacitive element 36 may be different, such that the first parallel LC resonator and the second parallel LC resonator resonate at different resonant frequencies. This may depend on a particular application. For example, different capacitances and/or inductances may be used to correct for impedance imbalances between the ports 12, 14, 16, 18.

To connect the first capacitive element 34 in parallel with the portion 38 of the first inductive element 26, the first capacitive element 34 shown in FIG. 1 is connected between the first port 12 and the fifth port 20. The fifth port 20 is then connected to the intermediary node 40, which may be formed by an intermediary tap to the first inductive element 26. Accordingly, the first capacitive element 34 and the portion 38 of the first inductive element 26 are configured as the first parallel LC resonator. Since the first parallel LC resonator blocks at resonance, the notch blocks unwanted frequency components (such as the third harmonic of the RF signal 24) from passing to the third port 16. The first RF QHS 30 is thus filtered by the first parallel LC resonator provided by the portion 38 of the first inductive element 26 and the first capacitive element 34. In this embodiment, the portion 38 is a segment of the first inductive element 26 provided between the first port 12 and the intermediary node 40. The first capacitive element 34 is also connected between the first port 12 and the intermediary node 40. Since the first port 12 is the input port of the hybrid coupler 10 shown in FIG. 1, the first parallel LC resonator is provided between the input port (i.e., the first port 12) and the intermediary node 40 by the hybrid coupler 10. The first parallel LC resonator is also connected in series between the first port 12 (i.e., the input port) and the third port 16 (i.e., the thru port).

To connect the second capacitive element 36 in parallel with the portion 42 of the second inductive element 28, the second capacitive element 36 shown in FIG. 1 is connected between the second port 14 and the sixth port 22. The sixth port 22 is then connected to the intermediary node 44, which may be formed by an intermediary tap to the second inductive element 28. Accordingly, the second capacitive element 36 and the portion 42 of the second inductive element 28 are configured as the second parallel LC resonator. Since the second parallel LC resonator blocks at resonance, the second parallel LC resonator provides the notch, which blocks unwanted frequency components (such as the third harmonic of the RF signal 24) from passing to the second port 14. The second RF QHS 32 is thus filtered by the second parallel LC resonator provided by the portion 42 of the second inductive element 28 and the second capacitive element 36. In this embodiment, the portion 42 is a segment of the second inductive element 28 provided between the second port 14 and the intermediary node 44. The second capacitive element 36 is also connected between the second port 14 and the intermediary node 44. Since the second port 14 is the coupled port of the hybrid coupler 10 shown in FIG. 1, the second parallel LC resonator is provided between the coupled port (i.e., the second port 14) and the intermediary node 44 by the hybrid coupler 10. The second parallel LC resonator is also connected in series between the second port 14 (i.e., the coupled port) and the fourth port 18 (i.e., the isolated port).

In this embodiment, the capacitances of the first capacitive element 34 and the second capacitive element 36 are approximately the same. However, in alternative embodiments, the capacitances of the first capacitive element 34 and the second capacitive element 36 may be different, such that the first parallel LC resonator and the second parallel LC resonator resonate at different frequencies. This may depend on a particular application. For example, different capacitances and/or inductances may be used depending on the impedances seen at the ports 12, 14, 16, 18 and the RF communication band of the RF signal 24.

Furthermore, the inductance of the first inductive element 26, and the inductance of the second inductive element 28, and the parasitic capacitance value of the parasitic capacitance CPAR may be set so as to provide an impedance matching network within the RF communication band of the RF signal 24. More specifically, the impedance matching network provides an impedance transformation at or near an RF signal frequency of the RF signal 24 that increases impedance matching between a first impedance between the first port 12 and the second port 14 and a second impedance between the third port 16 and the fourth port 18. Additionally, the impedance matching network provides an impedance transformation that increases impedance matching between an impedance at the first port 12 and an impedance at the third port 16. The impedance matching network also provides an impedance transformation that increases impedance matching between an impedance at the second port 14 and an impedance at the fourth port 18. Ideally, the hybrid coupler 10 perfectly matches the above-described impedances between the ports 12, 14, 16, 18. However, in practice, there may be some mismatches between these impedances despite the impedance transformations. An acceptable amount of mismatch may depend on the particular application for the hybrid coupler 10, along with RF communication band specifications.

The hybrid coupler 10 may be integrated into a substrate 46. The substrate 46 may be any type of suitable substrate, such as a semiconductor substrate, a laminated substrate, a dielectric substrate, an insulator substrate, a ceramic substrate, a fiber-based substrate, a glass substrate, and/or the like. For example, a metallic structure may be integrated into the substrate 46 where the hybrid coupler 10 would be formed by the metallic structure. With regard to implementation directed for an integrated circuit (IC) package, the hybrid coupler 10 may be integrated in a Front End of Line (FEOL) and/or a Back End of Line (BEOL) of the IC package. However, this disclosure is not limited to IC packages, and embodiments of the hybrid coupler 10 may be implemented using other types of technologies. For example, the hybrid coupler 10 could be incorporated using either vertically coupled (a.k.a. broad side coupled) or laterally coupled (a.k.a. edge coupled) transformers on laminate, Millimeter-Wave Monolithic Integrated Circuit (MIMIC), or IPD technology.

Figure 2:
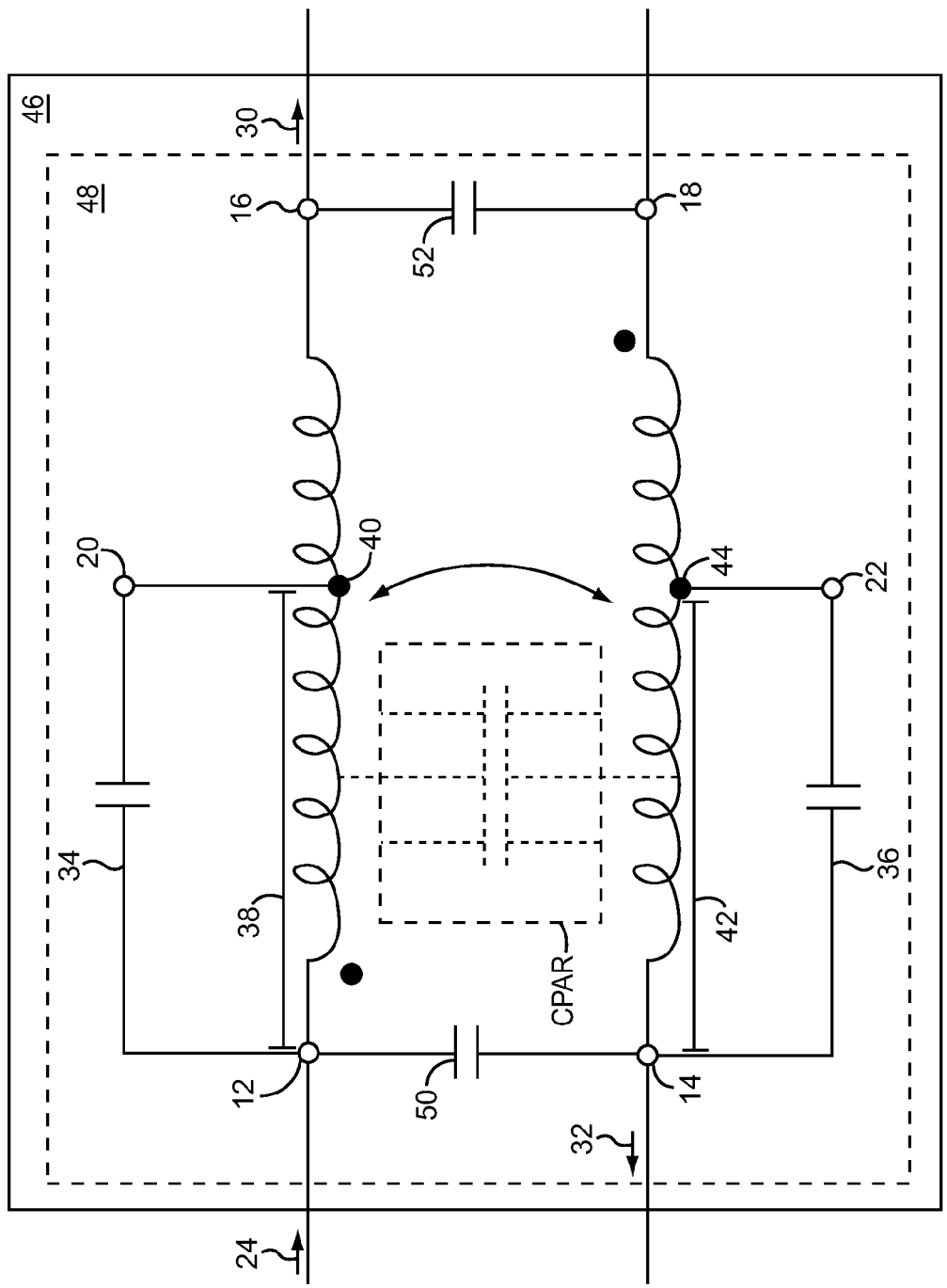

FIG. 2 illustrates another embodiment of a hybrid coupler 48. The hybrid coupler 48 is similar to the hybrid coupler 10 shown in FIG. 1, except that the hybrid coupler 48 further includes a third capacitive element 50 and a fourth capacitive element 52. The third capacitive element 50 is connected between the first port 12 and the second port 14, while the fourth capacitive element 52 is coupled between the third port 16 and the fourth port 18. In this embodiment, the largest and greatest capacitance is from the parasitic capacitance CPAR between the inductive elements 26, 28. However, the parasitic capacitance CPAR, by itself, may not align the passband of the RF signal 24 with the RF communication band as desired. As such, the capacitance of the first capacitive element 34 and the capacitance of the second capacitive element 36 are provided so that (in combination with the parasitic capacitance CPAR) the passband is centered or at least better aligned with the RF communication band of the RF signal 24. In this embodiment, the capacitances of the first capacitive element 34 and the second capacitive element 36 are approximately the same. However, in alternative embodiments, the capacitances of the first capacitive element 34 and the second capacitive element 36 may be different. This may depend on a particular application. For example, different capacitances and/or inductances may be used depending on the impedances seen at the ports 12, 14, 16, 18 and the RF communication band of the RF signal 24.

Figure 3:
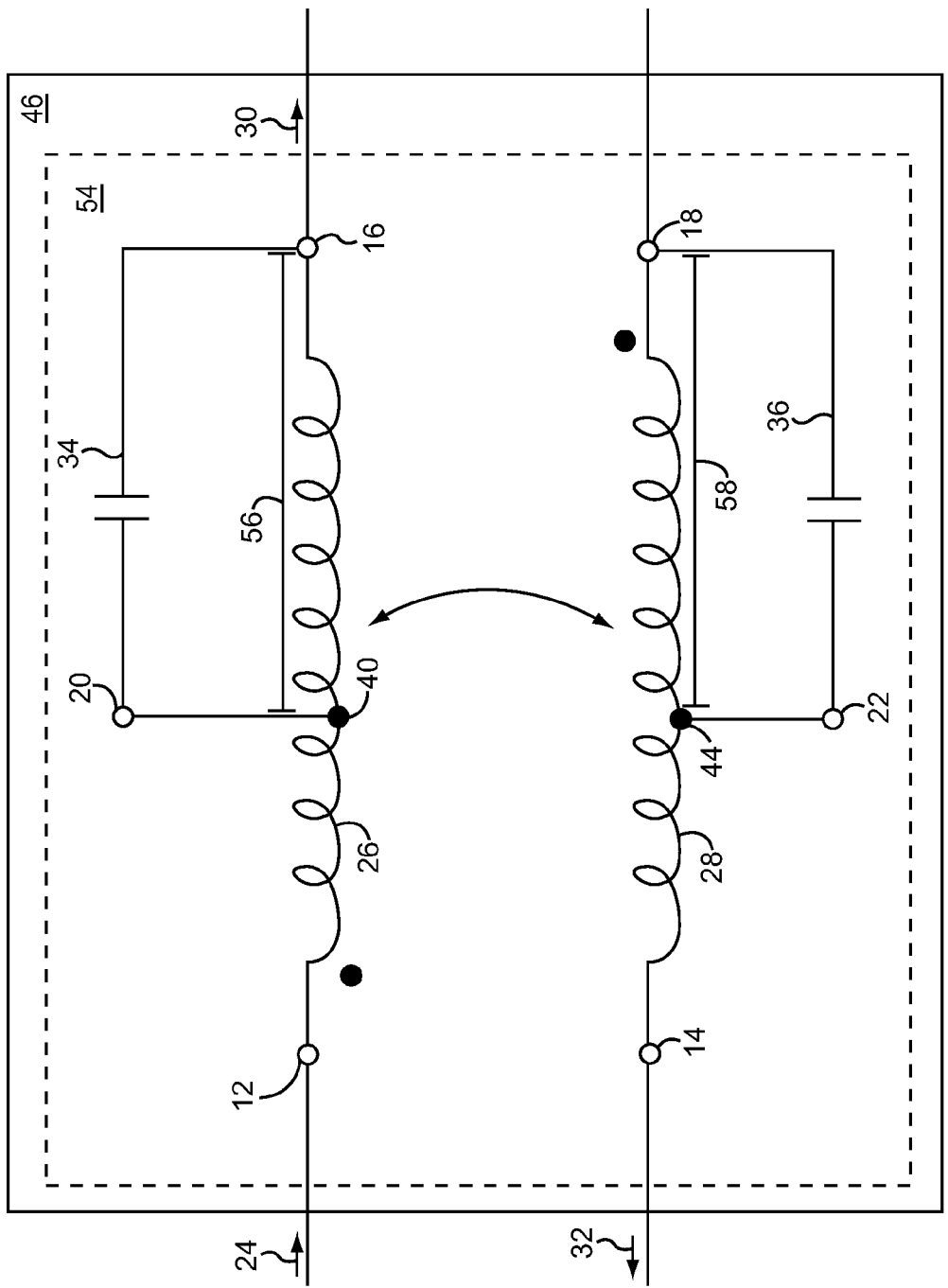

FIG. 3 illustrates still another embodiment of a hybrid coupler 54. The hybrid coupler 54 is similar to the hybrid coupler 10 illustrated in FIG. 1, except that in the hybrid coupler 54 shown in FIG. 3, the first capacitive element 34 is connected between the third port 16 and the intermediary node 40, while the second capacitive element 36 is connected between the fourth port 18 and the intermediary node 44. The first capacitive element 34 is thus connected in parallel with a portion 56 of the first inductive element 26. More specifically, the first capacitive element 34 of FIG. 3 is connected from the third port 16 to the intermediary node 40 of the first inductive element 26. As such, the first capacitive element 34 does not have to resonate with the entire first inductive element 26 to create a notch. Rather, the first capacitive element 34 is configured to create the notch by resonating with only the portion 56 of the first inductive element 26. The notch is placed at a resonant frequency defined by an inductance of the portion 56 of the first inductive element 26 and the capacitive value of the first capacitive element 34. In this manner, the notch may be set so as to filter out undesired harmonics (such as a third harmonic) of the first RF QHS 30 from the RF signal 24.

Similarly, the second capacitive element 36 is connected in parallel with a portion 58 of the second inductive element 28. More specifically, the second capacitive element 36 is connected from the fourth port 18 to the intermediary node 44 of the second inductive element 28. As such, the second capacitive element 36 does not resonate with the entire second inductive element 28 to create a notch. Rather, the second capacitive element 36 is configured to create the notch by resonating with only the portion 58 of the second inductive element 28. Since the portion 58 of the second inductive element 28 has a smaller inductance than the entire second inductive element 28, a notch is placed at a resonant frequency defined by an inductance of the portion 58 of the second inductive element 28 and a capacitance value of the second capacitive element 36. In this manner, the notch may be set so as to filter out undesired harmonics (such as a third harmonic) of the second RF QHS 32 from the RF signal 24.

In this embodiment, the inductances of the portion 56 and the portion 58 are approximately the same and the capacitances of the first capacitive element 34 and the second capacitive element 36 are approximately the same. As such, the first parallel LC resonator formed by the portion 56 of the first capacitive element 34 and the second parallel LC resonator formed by the portion 58 of the second capacitive element 36 each resonate at approximately the same resonant frequency. Alternatively, the inductances of the portion 56 and the portion 58 may be different and/or the capacitances of the first capacitive element 34 and the second capacitive element 36 may be different, such that the first parallel LC resonator and the second parallel LC resonator resonate at different resonant frequencies. This may depend on a particular application. For example, different capacitances and/or inductances may be used to correct for impedance imbalances between the ports 12, 14, 16, 18.

To connect the first capacitive element 34 in parallel with the portion 56 of the first inductive element 26, the first capacitive element 34 shown in FIG. 3 is connected between the third port 16 and the fifth port 20. The fifth port 20 is then connected to the intermediary node 40, which may be formed by an intermediary tap to the first inductive element 26. Accordingly, the first capacitive element 34 and the portion 56 of the first inductive element 26 are configured as a first parallel LC resonator. Since the first parallel LC resonator blocks at resonance, the notch blocks unwanted frequency components (such as the third harmonic of the RF signal 24) from passing to the third port 16. The first RF QHS 30 is thus filtered by the first parallel LC resonator provided by the portion 56 of the first inductive element 26 and the first capacitive element 34. In this embodiment, the portion 56 is a segment of the first inductive element 26 provided between the third port 16 and the intermediary node 40. The first capacitive element 34 is also connected between the third port 16 and the intermediary node 40. Since the third port 16 is the thru port of the hybrid coupler 54 shown in FIG. 3, the first parallel LC resonator is provided between the thru port (i.e., the third port 16) and the intermediary node 40 by the hybrid coupler 54. The first parallel LC resonator is also connected in series with the third port 16 (i.e., the thru port) and the first port 12 (i.e., the input port).

To connect the second capacitive element 36 in parallel with the portion 58 of the second inductive element 28, the second capacitive element 36 shown in FIG. 3 is connected between the fourth port 18 and the sixth port 22. The sixth port 22 is then connected to the intermediary node 44, which may be formed by an intermediary tap to the second inductive element 28. Accordingly, the second capacitive element 36 and the portion 58 of the second inductive element 28 are configured as a second parallel LC resonator. Since the second parallel LC resonator blocks at resonance, the notch blocks unwanted frequency components (such as the third harmonic of the RF signal 24) from passing to the second port 14. The second RF QHS 32 is thus filtered by the second parallel LC resonator provided by the portion 58 of the second inductive element 28 and the second capacitive element 36. In this embodiment, the portion 58 is a segment of the second inductive element 28 provided from the fourth port 18 to the intermediary node 44. The second capacitive element 36 is also connected to the fourth port 18 and the intermediary node 44. Since the fourth port 18 is the isolated port of the hybrid coupler 54 shown in FIG. 1, the second parallel LC resonator is provided between the isolated port (i.e., the fourth port 18) and the intermediary node 44 by the hybrid coupler 54. The second parallel LC resonator is also connected in series between the fourth port 18 (i.e., the isolated port) and the second port 14 (i.e., the coupled port).

In this embodiment, the capacitances of the first capacitive element 34 and the second capacitive element 36 are the approximately same. However, in alternative embodiments, the capacitances of the first capacitive element 34 and the second capacitive element 36 may be different, such that the first parallel LC resonator and the second parallel LC resonator resonate at different frequencies. This may depend on a particular application. For example, different capacitances and/or inductances may be used depending on the impedances seen at the ports 12, 14, 16, 18 and the RF communication band of the RF signal 24.

Figure 4:
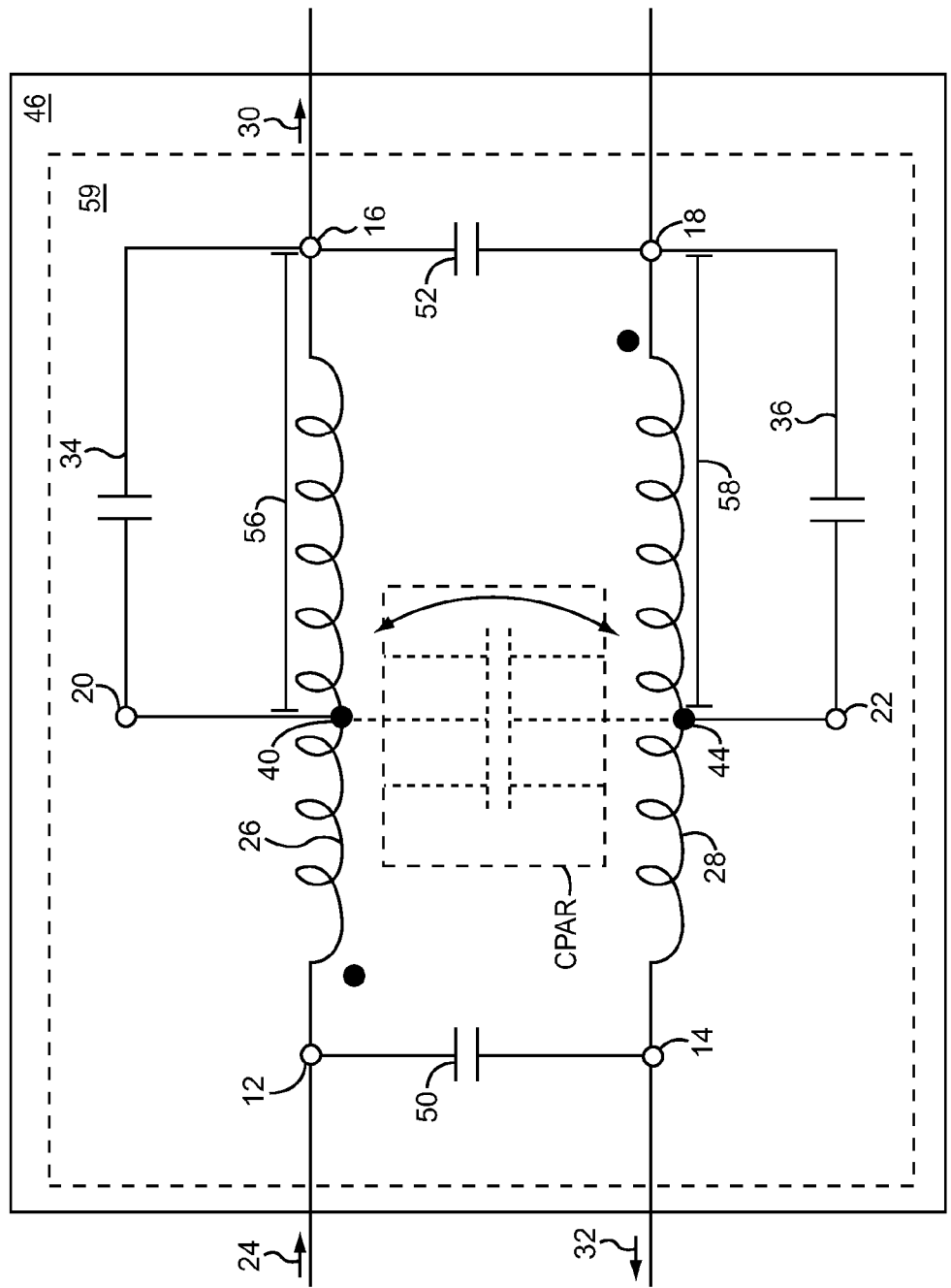
FIG. 4 illustrates still another embodiment of the hybrid coupler, wherein the hybrid coupler of FIG. 4 is like the hybrid coupler of FIG. 3, except that the hybrid coupler of FIG. 4 further includes a third capacitive element connected between the first port and the second port, and a fourth capacitive element connected between the third port and the fourth port.

FIG. 4 illustrates yet another embodiment of a hybrid coupler 59. The hybrid coupler 59 is similar to the hybrid coupler 54 shown in FIG. 3, except that the hybrid coupler 59 further includes a third capacitive element 50 and a fourth capacitive element 52, like the hybrid coupler 48 shown in FIG. 2. Thus, the third capacitive element 50 is connected between the first port 12 and the second port 14, while the fourth capacitive element 52 is coupled between the third port 16 and the fourth port 18. In this embodiment, the largest and greatest capacitive value is from the parasitic capacitance CPAR between the inductive elements 26, 28. However, the parasitic capacitance CPAR may not align as desired with the passband of the RF signal 24. As such, the capacitive value of the first capacitive element 34 and the capacitive value of the second capacitive element 36 are provided (in combination with the parasitic capacitance CPAR) such that the passband is centered, or at least better aligned with the RF communication band of the RF signal 24. In this embodiment, the capacitances of the first capacitive element 34 and the second capacitive element 36 are approximately the same. However, in alternative embodiments, the capacitances of the first capacitive element 34 and the second capacitive element 36 may be different. This may depend on a particular application. For example, different capacitances and/or inductances may be used depending on the impedances seen at the ports 12, 14, 16, 18 and the RF communication band of the RF signal 24.

Figure 5:
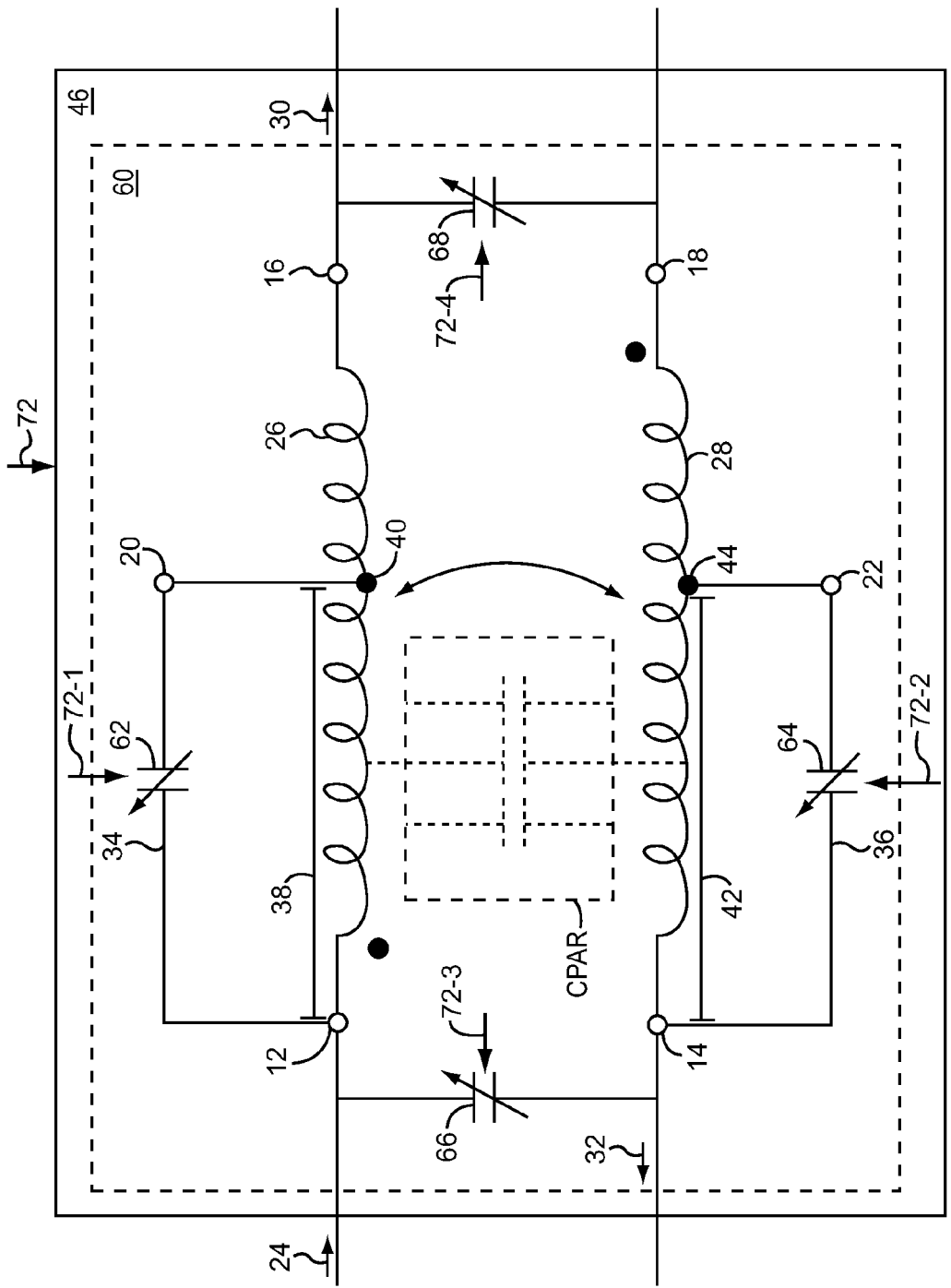
FIG. 5 illustrates still another embodiment of the hybrid coupler, wherein the hybrid coupler of FIG. 5 is like the hybrid coupler of FIG. 2, except that each of the first capacitive element, the second capacitive element, the third capacitive element, and the fourth capacitive element is a variable capacitive element.

FIG. 5 illustrates yet another embodiment of a hybrid coupler 60. The hybrid coupler 60 is similar to the hybrid coupler 48 shown in FIG. 2, except that in this embodiment, the hybrid coupler 60 includes a first variable capacitive element 62, rather than the first capacitive element 34 shown in FIG. 2; a second variable capacitive element 64, rather than the second capacitive element 36 shown in FIG. 2; a third variable capacitive element 66, rather than the third capacitive element 50 shown in FIG. 2; and a fourth variable capacitive element 68, rather than the fourth capacitive element 52 shown in FIG. 2. The hybrid coupler 60 is a tunable hybrid coupler.

As shown in FIG. 5, the first variable capacitive element 62 is connected between the first port 12 and the intermediary node 40 of the first inductive element 26. More specifically, the first variable capacitive element 62 is connected from the first port 12 to the fifth port 20, and the fifth port 20 is then connected to the intermediary node 40. As with the first capacitive element 34 shown in FIG. 2, the first variable capacitive element 62 is connected in parallel with the portion 38 of the first inductive element 26. Thus, the first variable capacitive element 62 and the portion 38 of the first inductive element 26 form a first parallel LC resonator. However, in this embodiment, the first variable capacitive element 62 is operable to provide a first variable capacitance. Thus, the first variable capacitance is adjustable. A resonant frequency of the first parallel LC resonator is defined by the first variable capacitance and the inductance of the portion 38. Accordingly, the first variable capacitance can be adjusted to shift the resonant frequency of the first parallel LC resonator. Since the resonant frequency is shiftable, a notch provided by the first parallel LC resonator at the resonant frequency is shiftable.

Additionally, the second variable capacitive element 64 is connected between the second port 14 and the intermediary node 44 of the second inductive element 28. More specifically, the second variable capacitive element 64 is connected from the second port 14 to the sixth port 22, and the sixth port 22 is then connected to the intermediary node 44. As with the second capacitive element 36 shown in FIG. 2, the second variable capacitive element 64 is connected in parallel with the portion 42 of the second inductive element 28. Thus, the second variable capacitive element 64 and the portion 42 of the second inductive element 28 form a second parallel LC resonator. However, in this embodiment, the second variable capacitive element 64 is operable to provide a second variable capacitance. Accordingly, the second variable capacitance is adjustable. A resonant frequency of the second parallel LC resonator is defined by the second variable capacitance and the inductance of the portion 42. Thus, the second variable capacitance can be adjusted to shift the resonant frequency of the second parallel LC resonator. Since the resonant frequency is shiftable, a notch provided by the second parallel LC resonator at the resonant frequency is shiftable.

As shown in FIG. 5, the third variable capacitive element 66 is connected between the first port 12 and the second port 14. As with the third capacitive element 50 shown in FIG. 2, the third variable capacitive element 66 is connected in parallel with the parasitic capacitance CPAR provided between the first inductive element 26 and the second inductive element 28. However, in this embodiment, the third variable capacitive element 66 is operable to provide a third variable capacitance. Accordingly, the third variable capacitance is adjustable.

Additionally, the fourth variable capacitive element 68 is connected between the third port 16 and the fourth port 18. As with the fourth capacitive element 52 shown in FIG. 2, the fourth variable capacitive element 68 is connected in parallel with the parasitic capacitance CPAR between the first inductive element 26 and the second inductive element 28. However, in this embodiment, the fourth variable capacitive element 68 is operable to provide a fourth variable capacitance. Accordingly, the fourth variable capacitance is adjustable.

In this embodiment, the parasitic capacitance CPAR between the first inductive element 26 and the second inductive element 28 is significantly greater than a highest capacitive value of the variable capacitances provided by the variable capacitive elements 62, 64, 66, and 68. As such, the largest and greatest capacitive impedance is from the parasitic capacitance CPAR between the first inductive element 26 and the second inductive element 28. Also, the parasitic capacitance CPAR sets a minimum capacitance between the first inductive element 26 and the second inductive element 28. Accordingly, the primary capacitive impedance between the first port 12 and the second port 14, and between the third port 16 and the fourth port 18, is from the parasitic capacitance CPAR between the first inductive element 26 and the second inductive element 28.

However, the hybrid coupler 60 has a frequency response that defines the passband and the hybrid coupler 60 is tunable so as to shift the passband. More specifically, the hybrid coupler 60 is tunable so as to shift the passband into different RF communication bands. In this embodiment, the third variable capacitance of the third variable capacitive element 66 can be adjusted, and the fourth variable capacitance of the fourth variable capacitive element 68 can be adjusted, so that the passband can be shifted to include any one of the different RF communication bands. Thus, if the RF communication band is set to a particular RF communication band, the hybrid coupler 60 may be tuned to shift the passband to include the particular RF communication band. Since the hybrid coupler 60 is tunable to shift the passband, the hybrid coupler 60 is configured to split the RF signal 24 into the first RF QHS 30 and the second RF QHS 32, even through the RF signal frequency of the RF signal 24 can be provided in different RF communication bands. The passband blocks spurious emissions and noise in the first RF QHS 30 and the second RF QHS 32 from the RF signal 24 outside the passband.

The hybrid coupler 60 also is configured to provide a frequency response with the notch at the resonant frequency from and to the first port 12 and the second port 14 as a result of the first parallel LC resonator with the first variable capacitive element 62 and the portion 38 of the first inductive element 26. Accordingly, the notch provided by the first parallel LC resonator can be set in accordance with the particular RF communication band of the RF signal 24. As mentioned above, the notch provided by the first parallel LC resonator is shiftable. Since the first parallel LC resonator blocks at resonance, the first variable capacitance of the first variable capacitive element 62 can be adjusted so that the notch filters out undesired harmonics of the first RF QHS 30 from the RF signal 24. For example, the first variable capacitance can be adjusted so that the notch is shifted to the third harmonic of the RF signal 24 operating within any one of the different RF communication bands.

In addition, the hybrid coupler 60 is also configured to provide the frequency response with the notch at the resonant frequency from and to the third port 16 and the fourth port 18, as a result of the second parallel LC resonator with the second variable capacitive element 64 and the portion 42 of the second inductive element 28. As mentioned above, the notch provided by the second parallel LC resonator is shiftable. The resonant frequency of the second parallel LC resonator is defined by the second variable capacitance and the inductance of the second inductive element 28. Since the second parallel LC resonator blocks at resonance, the second variable capacitance of the second variable capacitive element 64 can be adjusted so that the notch filters out undesired harmonics of the second RF QHS 32 from the RF signal 24. For example, the second variable capacitance can be adjusted so that the notch is shifted to the third harmonic of the RF signal 24 operating within any one of the different RF communication bands.

Furthermore, the first inductive element 26, the second inductive element 28, the first variable capacitive element 62, and the second variable capacitive element 64 form an impedance matching network for a 4-port system. The impedance matching network provides impedance transformations so as to increase impedance matching at the first port 12, the second port 14, the third port 16, and the fourth port 18. Since the hybrid coupler 60 is tunable, the first variable capacitance and the second variable capacitance can be adjusted to provide impedance matching when the RF signal 24 is in any one of the RF communication bands. Furthermore, since the impedances at the ports 12, 14, 16, 18 can fluctuate, adjustments can be made to the first variable capacitance and the second variable capacitance to maintain impedance matching. For example, despite fluctuations in impedances at the ports 12, 14, 16, 18, the first variable capacitance and the second variable capacitance can be adjusted so that an impedance transformation substantially matches an impedance between the first port 12 and the second port 14 and an impedance between the third port 16 and the fourth port 18.

Figure 6:
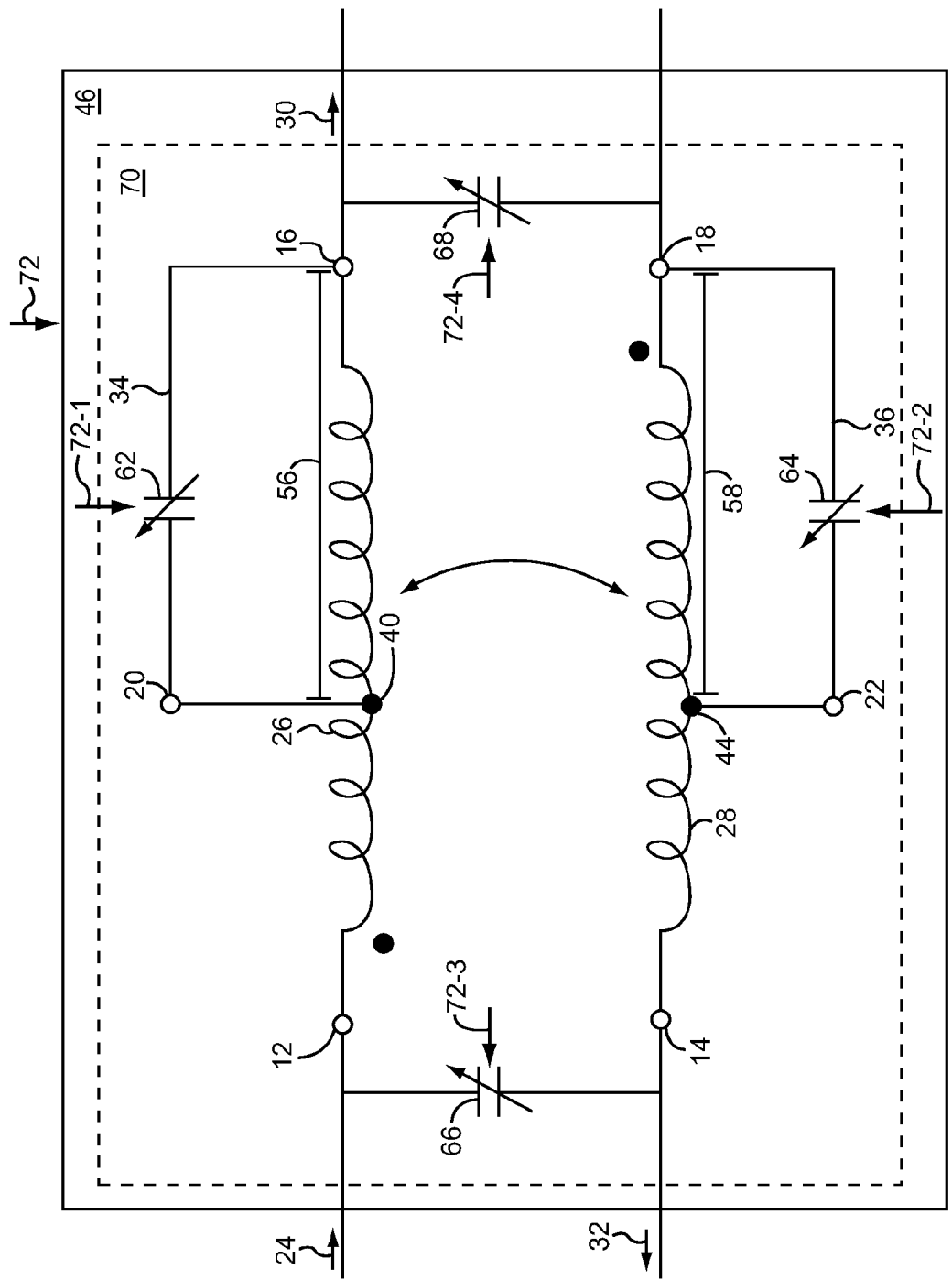
FIG. 6 illustrates still another embodiment of the hybrid coupler, wherein the hybrid coupler of FIG. 6 is like the hybrid coupler of FIG. 4, except that each of the first capacitive element, the second capacitive element, the third capacitive element, and the fourth capacitive element is a variable capacitive element.

FIG. 6 illustrates still another embodiment of a hybrid coupler 70. The hybrid coupler 70 is similar to the hybrid coupler 60 illustrated in FIG. 5, except that in the hybrid coupler 70 shown in FIG. 6, the first variable capacitive element 62 is connected between the third port 16 and the intermediary node 40, while the second variable capacitive element 64 is connected between fourth port 18 and the intermediary node 44. The first variable capacitive element 62 is thus connected in parallel with the portion 56 of the first inductive element 26. More specifically, the first capacitive element 34 of FIG. 6 is connected from the third port 16 to the fifth port 20, and the fifth port 20 is connected to the intermediary node 40 of the first inductive element 26. As such, the first variable capacitive element 62 does not resonate with the entire first inductive element 26 to provide a notch. The portion 56 of the first inductive element 26 and the first variable capacitive element 62 thus form a first parallel LC resonator.

The hybrid coupler 70 is configured to provide a frequency response with the notch at the resonant frequency from and to the first port 12 and the second port 14, as a result of the first parallel LC resonator with the first variable capacitive element 62 and the portion 56 of the first inductive element 26. The resonant frequency of the first parallel LC resonator is defined by the first variable capacitance and the inductance of the portion 56. Accordingly, the resonant frequency is shiftable because the first variable capacitance of the first variable capacitive element 62 is adjustable. The notch is set at the resonant frequency. Since the first parallel LC resonator blocks at resonance, the first variable capacitance of the first variable capacitive element 62 can be adjusted to shift the resonant frequency and the notch so that the notch filters out undesired harmonics of the first RF QHS 30 from the RF signal 24. For example, the first variable capacitive element 62 can be adjusted so that the notch is shifted to the third harmonic of the RF signal 24 operating within any one of the different RF communication bands.

The second variable capacitive element 64 is thus connected in parallel with the portion 58 of the second inductive element 28. More specifically, the second variable capacitive element 64 of FIG. 6 is connected from the fourth port 18 to the sixth port 22, and the sixth port 22 is connected to the intermediary node 44 of the second inductive element 28. As such, the second variable capacitive element 64 does not resonate with the entire first inductive element 26 to provide a notch. The portion 58 of the second inductive element 28 and the second variable capacitive element 64 thus form a second parallel LC resonator.

The hybrid coupler 70 is configured to provide the frequency response with the notch at the resonant frequency from and to the third port 16 and the fourth port 18, as a result of the second parallel LC resonator with the second variable capacitive element 64 and the portion 58 of the second inductive element 28. A resonant frequency of the second parallel LC resonator is defined by the second variable capacitance and the inductance of the portion 58. Accordingly, the resonant frequency is shiftable because the second variable capacitance of the second variable capacitive element 64 is adjustable. The notch is set at the resonant frequency. Since the second parallel LC resonator blocks at resonance, the second variable capacitance of the second variable capacitive element 64 can be adjusted to shift the resonant frequency and the notch so that the notch filters out undesired harmonics of the second RF QHS 32 from the RF signal 24. For example, the second variable capacitive element 64 can be adjusted so that the notch is shifted to the third harmonic of the RF signal 24 operating within any one of the different RF communication bands.

Referring now to FIGS. 5 and 6, each of the hybrid couplers 60, 70 is configured to receive a hybrid control output 72 from a tuning circuit. The hybrid control output 72 includes one or more hybrid control signals 72-1, 72-2, 72-3, and 72-4. Each of the variable capacitive elements 62, 64, 66, 68 is configured to set its respective variable capacitance in accordance with a signal level of a corresponding one of the hybrid control signals 72-1, 72-2, 72-3, and 72-4. For example, the first variable capacitive element 62 is configured to set the first variable capacitance in accordance with a signal level of the hybrid control signal 72-1. Additionally, the second variable capacitive element 64 is configured to set the second variable capacitance in accordance with a signal level of the hybrid control signal 72-2. Furthermore, the third variable capacitive element 66 is configured to set the third variable capacitance in accordance with a signal level of the hybrid control signal 72-3. Finally, the fourth variable capacitive element 68 is configured to set the fourth variable capacitance in accordance with a signal level of the hybrid control signal 72-4. Thus, the first variable capacitance, the second variable capacitance, the third variable capacitance, and the fourth variable capacitance are each configured to be adjusted in accordance with the respective signal level of the corresponding one of the respective hybrid control signals 72-1, 72-2, 72-3, and 72-4. In this manner, each of the hybrid couplers 60, 70 can be tuned to increase impedance matching between the impedances at the ports 12, 14, 16, 18, to shift the passband within the different RF communication bands, and to shift the notches.

Figure 7:
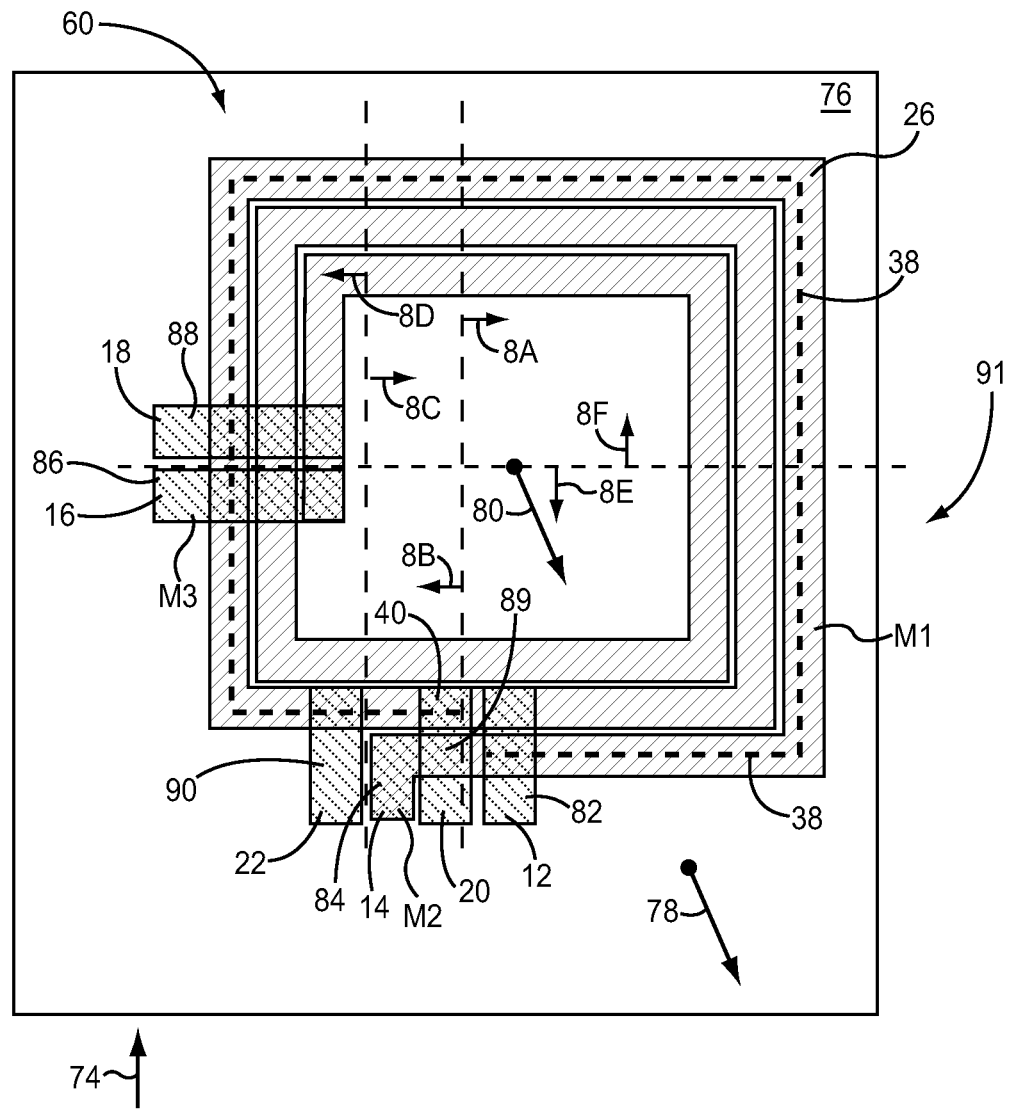
FIG. 7 illustrates one embodiment of the hybrid coupler shown in FIG. 5 provided in a Back End of Line (BEOL) of an integrated circuit (IC) package.

FIG. 7 illustrates one embodiment of the hybrid coupler 60 shown in FIG. 5 integrated into a substrate 74 of a BEOL within an IC package. As such, the substrate 74 in this example is an insulating substrate. The substrate 74 may be formed by a plurality of insulating layers formed from an insulating material. The insulating material that forms the insulating layers may be a dielectric, a laminate, fibers, glass, ceramic, and/or the like. For example, the dielectric may be a Silicon Oxide ($SiO_x$). The laminate may be FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like.

A metallic structure is integrated into the substrate 74 of the BEOL to form connections to the IC in a semiconductor substrate housed within the IC package. The metallic structure may be made from any type of metal, such as, for example, copper (Cu), gold (Au), silver (Ag), Nickel (Ni), Aluminum (Al), and/or the like. The metallic material may also include metallic alloys and other metallic materials mixed with or forming ionic or covalent bonds with other non-metallic materials to provide a desired material property. For example, the metallic structure may include metallic layers on and between the insulating layers, with conductive vias forming connections between the metallic layers and to the semiconductor substrate. In FIG. 7, the BEOL includes four metallic layers. The hybrid coupler 60 has been formed by the metallic layers (and vias) provided by the BEOL, as explained in further detail below.

The substrate 74 has a surface 76. The surface 76 thus defines a direction 78 normal to the surface 76. Terms in this disclosure referring to directional words such as "over" or "top" and "under" or "beneath" are made with respect to the direction 78 defined by the surface 76 of the substrate 74. The first inductive element 26 of the hybrid coupler 60 is provided by a metallic layer M1 on the surface 76 of the substrate 74. The first inductive element 26 is formed as a spiral coil. The first inductive element 26 is wound about a central axis 80 to form turns that have increasing circumferences the more outward the turns are from the central axis 80. In this embodiment, the first inductive element 26 has two and three-quarters windings.

The first port 12 is provided by the metallic layer M1 and is connected to an end at an outermost winding of the first inductive element 26. A transverse bridge 82 in the metallic layer M1 connects the first port 12 to the first inductive element 26. The transverse bridge 82 thus extends transversely with respect to the outermost winding of the first inductive element 26. In this manner, a path to the semiconductor substrate beneath the BEOL can connect to the first port 12. The first port 12 can thus receive the RF signal 24 (not shown in FIG. 7) from the IC formed by the semiconductor substrate in the IC package.

Additionally, the second inductive element 28 (not shown in FIG. 7) is formed as a spiral coil within the substrate 74. In this embodiment, the second inductive element 28 is below the first inductive element 26 and is formed by a metallic layer M2 below the metallic layer M1. In this manner, the first inductive element 26 and the second inductive element 28 are inductively coupled so that the magnetic flux of each one of the inductive elements 26, 28 induces a current in the other one of the inductive elements 28, 26. In this embodiment, the second inductive element 28 is directly beneath the first inductive element 26. As such, the second inductive element 28 is wound about the same central axis 80 to form turns that have increasing circumferences the more outward the turns are from the central axis 80. Since the first inductive element 26 and the second inductive element 28 share the same central axis 80 (at least within acceptable error tolerances), the first inductive element 26 and the second inductive element 28 are substantially vertically aligned. Furthermore, the second inductive element 28 in this embodiment is substantially identical to the first inductive element 26 and thus also has two and three-quarters windings. Accordingly, the first inductive element 26, and the second inductive element 28 have a turns ratio of one (1). The turns ratio and the number of windings in alternative embodiments may be different depending on the particular application.

As shown in FIG. 7, the second port 14 is provided by the metallic layer M2 and is connected to an end of the second inductive element 28 at an outermost winding of the second inductive element 28. A transverse bridge 84 in the metallic layer M2 connects the second port 14 to the second inductive element 28. The transverse bridge 84 thus extends transversely with respect to the outermost winding of the second inductive element 28. In this manner, a path to the semiconductor substrate beneath the BEOL can connect to the second port 14. The second port 14 can thus output the second RF QHS 32 (not shown in FIG. 7) to the IC formed by the semiconductor substrate in the IC package. Note that the transverse bridge 82 is horizontally misaligned with the transverse bridge 84 so that the paths to the semiconductor substrate beneath the BEOL don't short.

The third port 16 is provided by a metallic layer M3 within the substrate 74 and is connected to an end at an innermost winding of the first inductive element 26. More specifically, the third metallic layer M3 is beneath the second metallic layer M2. A transverse bridge 86 extends transversely with respect to the innermost winding of the first inductive element 26 and, as explained in further detail below, a conductive via connects the transverse bridge 86 to the end of the first inductive element 26 at the innermost winding. In this manner, a path to the semiconductor substrate beneath the BEOL can connect to the third port 16. The third port 16 can thus output the first RF QHS 30 (not shown in FIG. 7) to the IC formed by the semiconductor substrate in an IC package 91.

The fourth port 18 is provided by the metallic layer M3 within the substrate 74 and is connected to an end at an innermost winding of the second inductive element 28. A transverse bridge 88 extends transversely with respect to the innermost winding of the second inductive element 28 and, as explained in further detail below, a conductive via connects the transverse bridge 88 to the end of the second inductive element 28 at the innermost winding. In this manner, a path to the semiconductor substrate beneath the BEOL can connect to the fourth port 18. The fourth port 18 can thus be connected to a load (not shown in FIG. 7) formed by the semiconductor substrate in the IC package 91. Note that the transverse bridge 86 is horizontally misaligned with the transverse bridge 88 so that the paths to the semiconductor substrate beneath the BEOL don't short.

The fifth port 20 is provided by the metallic layer M1 and is connected to an intermediary winding of the first inductive element 26. The intermediary winding is wound between the outermost winding and the innermost winding. A transverse bridge 89 extends transversely with respect to the intermediary winding and connects to the intermediary node 40. The transverse bridge 89 thus provides the connection to the portion 38 of first inductive element 26. In this manner, first variable capacitive element 62 (not shown in FIG. 7) can be connected between the first port 12 and the intermediary node 40.

The sixth port 22 provided by the metallic layer M2 and is connected to an intermediary winding of the second inductive element 28. The intermediary winding is wound between the outermost winding and the innermost winding. A transverse bridge 90 extends transversely with respect to the intermediary winding and connects to the intermediary node 44 (not shown in FIG. 7). The transverse bridge 90 thus provides the connection to the portion 42 (not shown in FIG. 7) of second inductive element 28. In this manner, the second variable capacitive element 64 (not shown in FIG. 7) can be connected between the second port 14 and the intermediary node 44. Note that the transverse bridges 82, 84, 89, and 90 are each horizontally misaligned with respect to one another so that the paths to the transverse bridges 82, 84, 89, and 90 aren't shorted.

FIGS. 8A-8F each illustrate different cross-sections of the substrate 74 with the hybrid coupler 60 shown in FIG. 7. The substrate 74 and the metallic structure used to form the hybrid coupler 60 are in the BEOL of the IC package 91. In this embodiment, the BEOL of the IC package 91 is a 5PAe 4DM BEOL. The BEOL is formed over a FEOL. The FEOL includes a semiconductor substrate 92 and IC devices (ICDs) formed over or within the semiconductor substrate 92. In this example, the ICDs are active semiconductor components such as transistors, diodes, light-emitting diodes (LEDs), varactors, and/or the like. However, the hybrid coupler 60 may be implemented for use in any number of IC applications. Thus, alternatively or additionally, the ICDs within the FEOL may be or include passive elements depending on an IC design being implemented with the IC package 91. The metallic structure of the BEOL includes the metallic layers M1, M2, and M3, which were described above with respect to FIG. 7. In addition, the metallic structure includes a metallic layer M4 that is below the metallic layer M3 and within the substrate 74 of the BEOL. The metallic layer M4 may be used to form traces and pads used to connect to the semiconductor substrate 92 in the FEOL. In this embodiment, the metallic layer M1 and the metallic layer M2 are formed from copper (Cu), while the metallic layer M3 and the metallic layer M4 are made of aluminum (Al). In the 5PAe 4DM BEOL, each of the metallic layers M1, M2 is relatively thick in comparison to each of the metallic layers M3, M4.

Figure 8A:
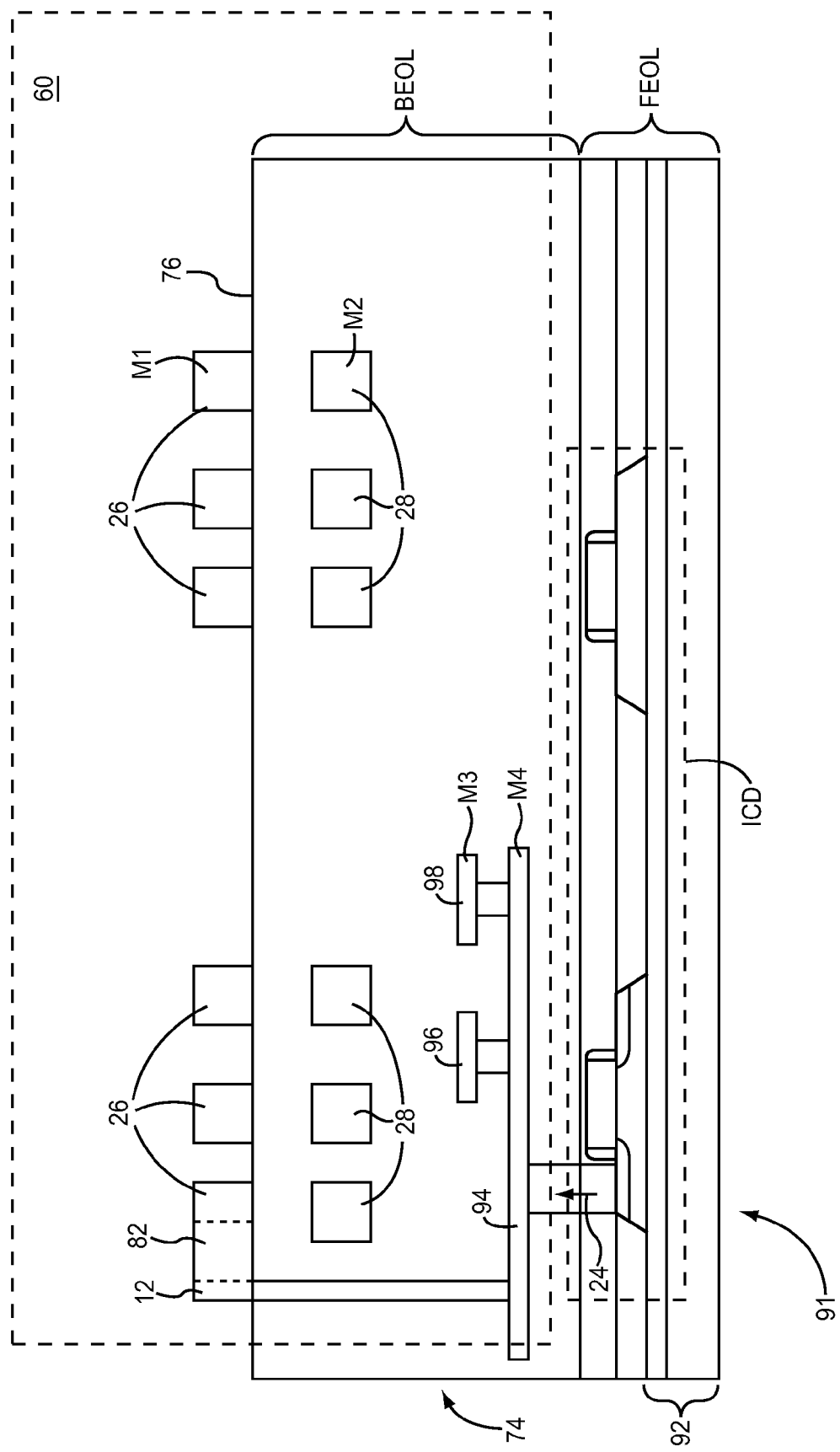
FIGS. 8A-8F illustrate different cross-sections of the hybrid coupler shown in FIG. 7.

Referring now to FIGS. 5, 7, and 8A, FIG. 8A illustrates a first cross-section of the hybrid coupler 60 shown in FIG. 7 that includes the first port 12 and the transverse bridge 82 from the first port 12 to the end of the first inductive element 26 at the outermost winding. As shown in FIG. 8A, the first inductive element 26 is formed on the metallic layer M1 on the surface 76 of the substrate 74. The second inductive element 28 is formed below the first inductive element 26 in the metallic layer M2. The transverse bridge 82 also allows for a conductive via to connect the first port 12 to a trace 94 formed in the metallic layer M4. The trace 94 is then connected to the semiconductor substrate 92. In this manner, the first port 12 can receive the RF signal 24 from the semiconductor substrate 92 in the FEOL. The trace 94 also connects to a trace 96 and a trace 98 in the metallic layer M3. The trace 96 provides the first port 12 with a connection to the first variable capacitive element 62 (shown in FIG. 5) and the trace 98 provides the first port 12 with a connection to the third variable capacitive element 66 (shown in FIG. 5).

Figure 8B:
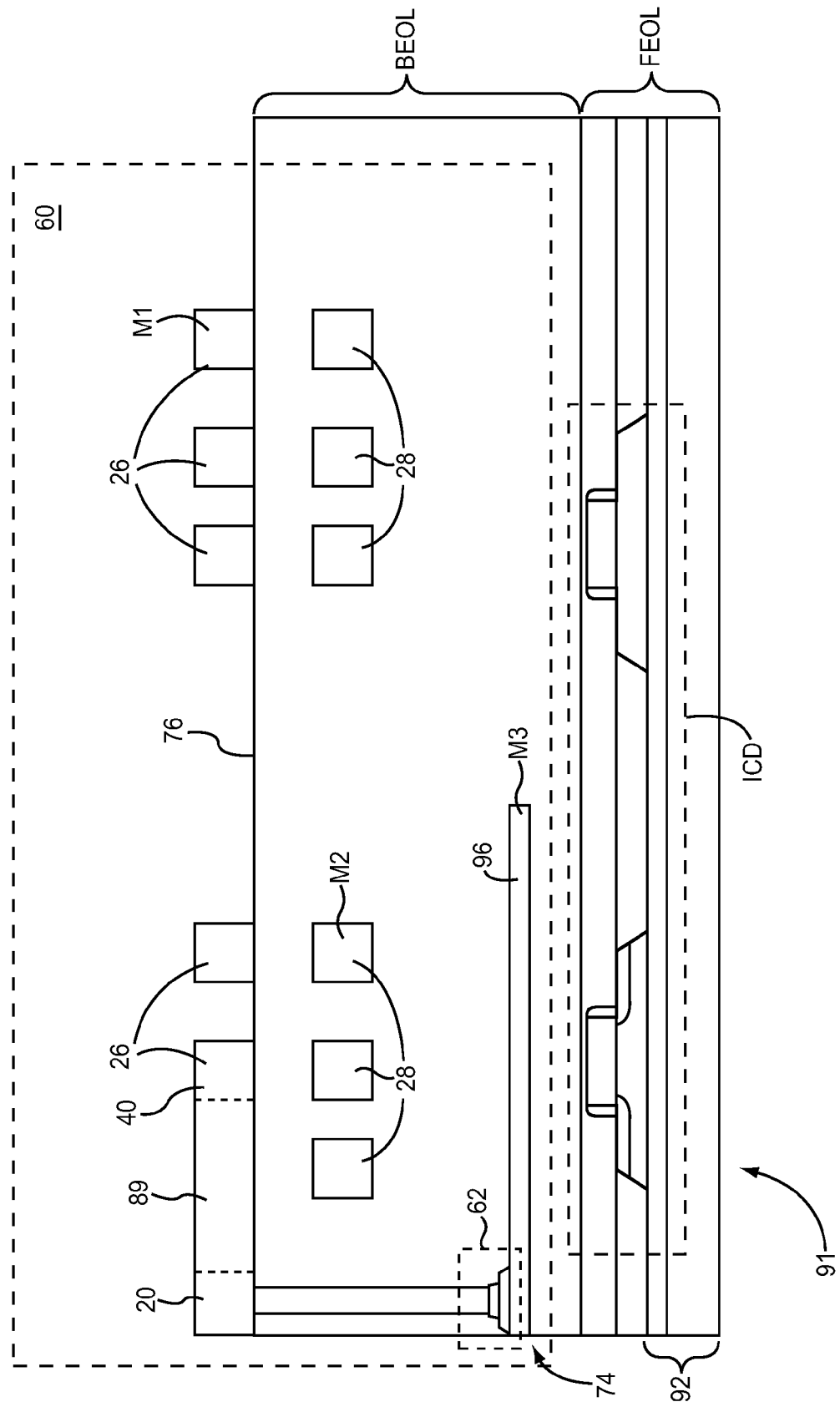

Referring now to FIGS. 5, 7, and 8B, FIG. 8B illustrates a second cross-section of the hybrid coupler 60 shown in FIG. 7 that includes the fifth port 20 and the transverse bridge 89. The transverse bridge 89 is provided between the intermediary node 40 of the intermediary winding of the first inductive element 26 and the fifth port 20. The transverse bridge 89 allows for a conductive via to connect the fifth port 20 to the first variable capacitive element 62. The first variable capacitive element 62 is a metal-insulator-metal (MIM) capacitive element formed from the metallic layer M3, a dielectric film, and a metallic film. The trace 96 is connected to the first variable capacitive element 62, thereby also connecting the first variable capacitive element 62 to the first port 12 (shown in FIG. 8A).

Figure 8C:
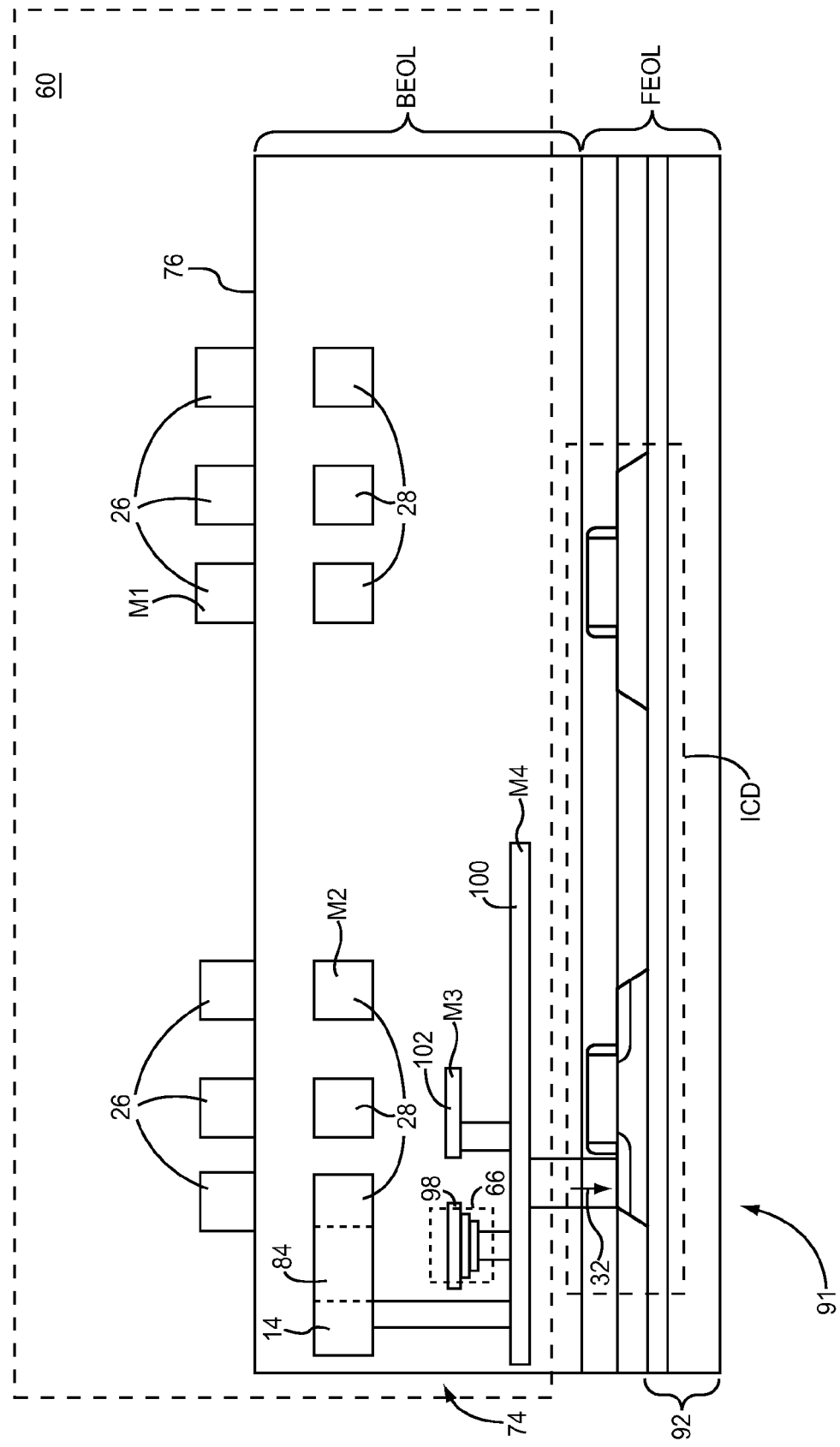

Referring now to FIGS. 5, 7, and 8C, FIG. 8C illustrates a third cross-section of the hybrid coupler 60 shown in FIG. 7 that includes the second port 14 and the transverse bridge 84 from the second port 14 to the end of the second inductive element 28 at the outermost winding. As shown in FIG. 8C, the second inductive element 28 is formed on the metallic layer M2 within the substrate 74 of the BEOL. The transverse bridge 84 also allows for a conductive via to connect the second port 14 to a trace 100 formed in the metallic layer M4. The trace 100 is then connected to the semiconductor substrate 92. In this manner, the second port 14 can output the second RF QHS 32 to the semiconductor substrate 92 in the FEOL. The trace 100 also connects the second port 14 to the third variable capacitive element 66, which is also formed as a MIM capacitor. The trace 98 is connected to the third metallic layer M3, then connects the third variable capacitive element 66 to the first port 12 (shown in FIG. 8A). A trace 102 is also formed in the metallic layer M3, and is connected to the trace 100 in the metallic layer M4. The trace 102 provides the second port 14 with a connection to the second variable capacitive element 64 (shown in FIG. 5).

Figure 8D:
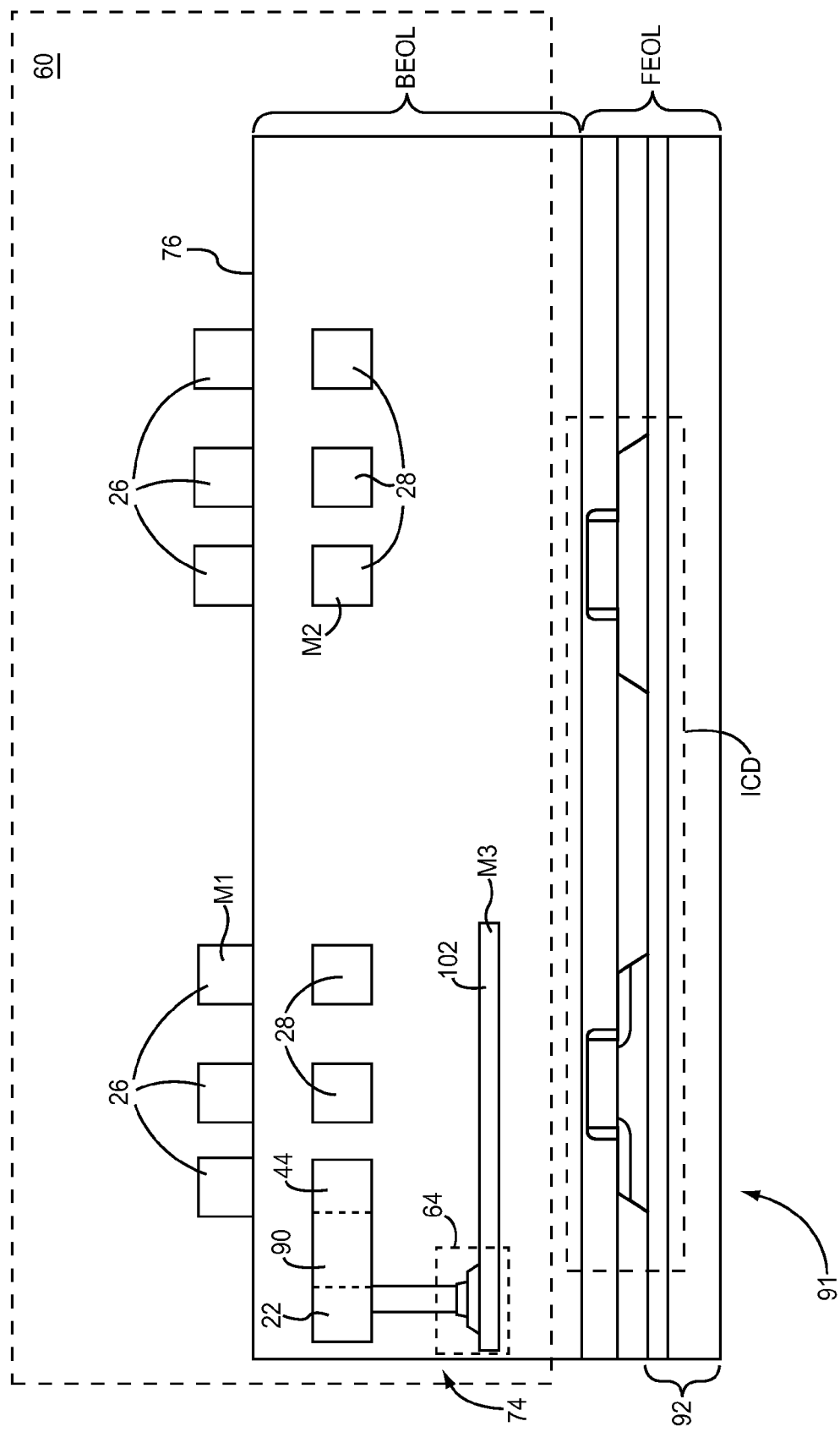

Referring now to FIGS. 5, 7, and 8D, FIG. 8D illustrates a fourth cross-section of the hybrid coupler 60 shown in FIG. 7 that includes the sixth port 22 and the transverse bridge 90 from the sixth port 22 to the intermediary node 44 of the second inductive element 28. As shown in FIG. 8C, the second inductive element 28 is formed on the metallic layer M2 within the substrate 74 of the BEOL. The transverse bridge 90 also allows for a conductive via to connect the sixth port 22 to the second variable capacitive element 64, which in this example is a MIM capacitor. The trace 102 formed in the metallic layer M3 then connects the second variable capacitive element 64 to the second port 14 (shown in FIG. 8C).

Figure 8E:
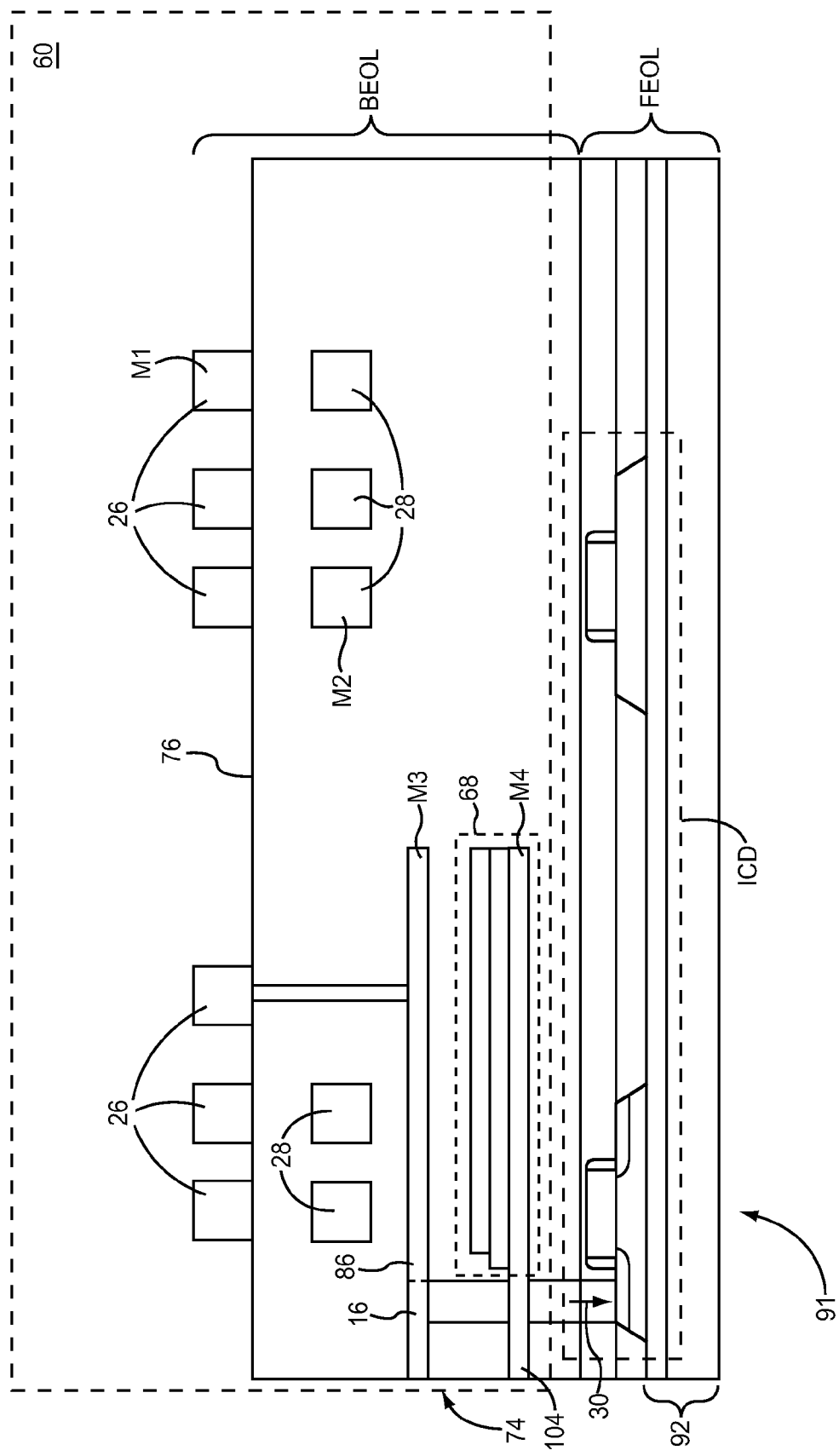

Referring now to FIGS. 5, 7, and 8E, FIG. 8E illustrates a fifth cross-section of the hybrid coupler 60 shown in FIG. 7 that includes the third port 16 and the transverse bridge 86. The transverse bridge 86 is provided in the metallic layer M3 so that a conductive via can connect to the end of the first inductive element 26 at the innermost winding. More specifically, the conductive via connects to the transverse bridge 86, and the transverse bridge 86 connects to the third port 16. The third port 16 then connects to the fourth variable capacitive element 68, which in this example is a MIM capacitor formed with the metallic layer M4. The third port 16 is also connected to a trace 104 in the metallic layer M4. The trace 104 is connected to the semiconductor substrate 92. In this manner, the third port 16 can output the first RF QHS 30 to the semiconductor substrate 92 in the FEOL.

Figure 8F:
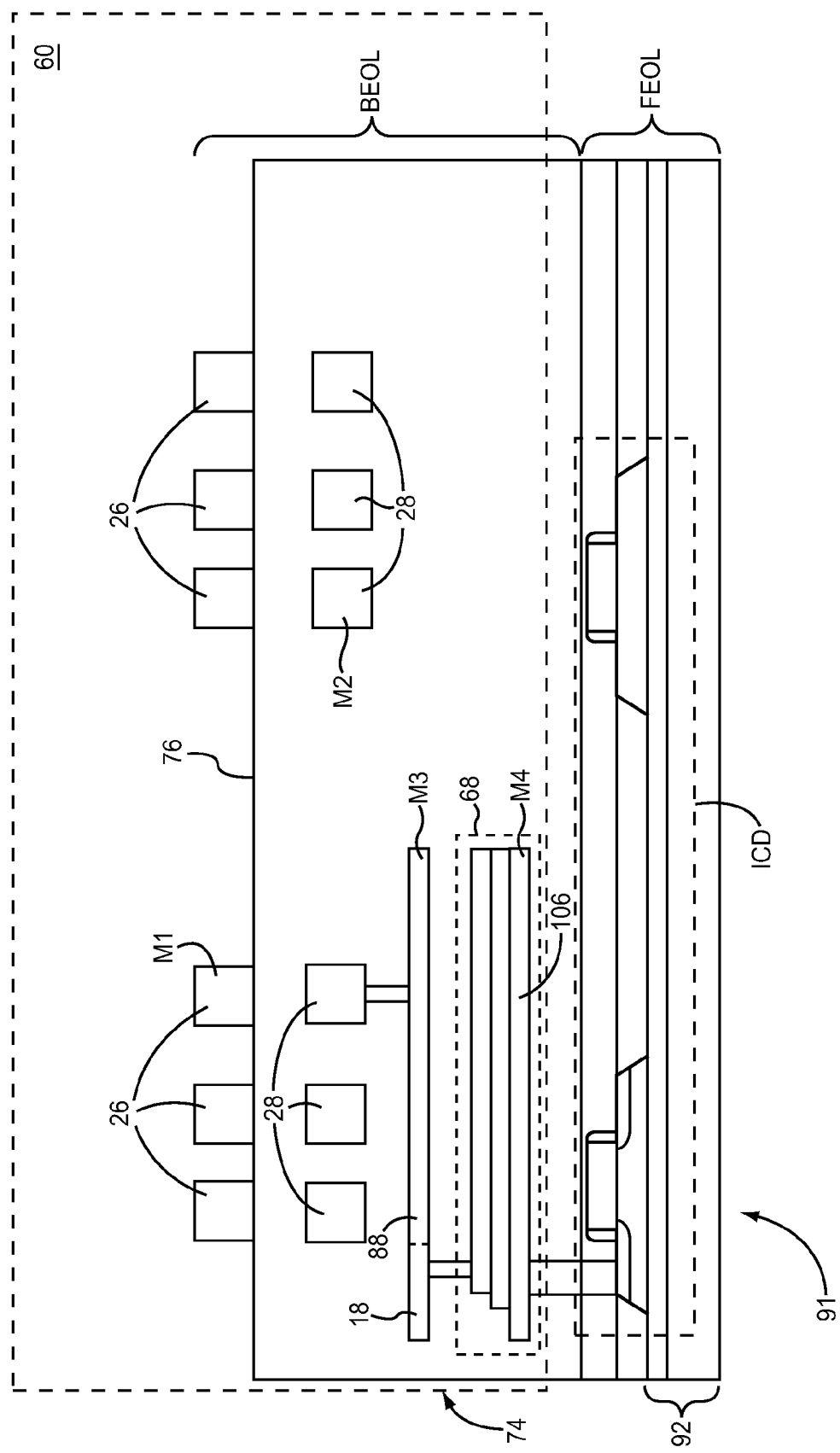

Referring now to FIGS. 5, 7, and 8F, FIG. 8F illustrates a sixth cross-section of the hybrid coupler 60 shown in FIG. 7 that includes the fourth port 18 and the transverse bridge 88. The transverse bridge 88 is provided in the metallic layer M3 so that a conductive via can connect to the end of the second inductive element 28 at the innermost winding. More specifically, the conductive via connects to the transverse bridge 88, and the transverse bridge 86 connects to the fourth port 18. The fourth port 18 then connects to the fourth variable capacitive element 68, which in this example is a MIM capacitor formed with the metallic layer M4. The fourth port 18 is also connected to a trace 106 in the metallic layer M4. The trace 106 is connected to the semiconductor substrate 92. In this manner, the fourth port 18 can output the first RF QHS 30 to the semiconductor substrate 92 in the FEOL.

Figure 9:
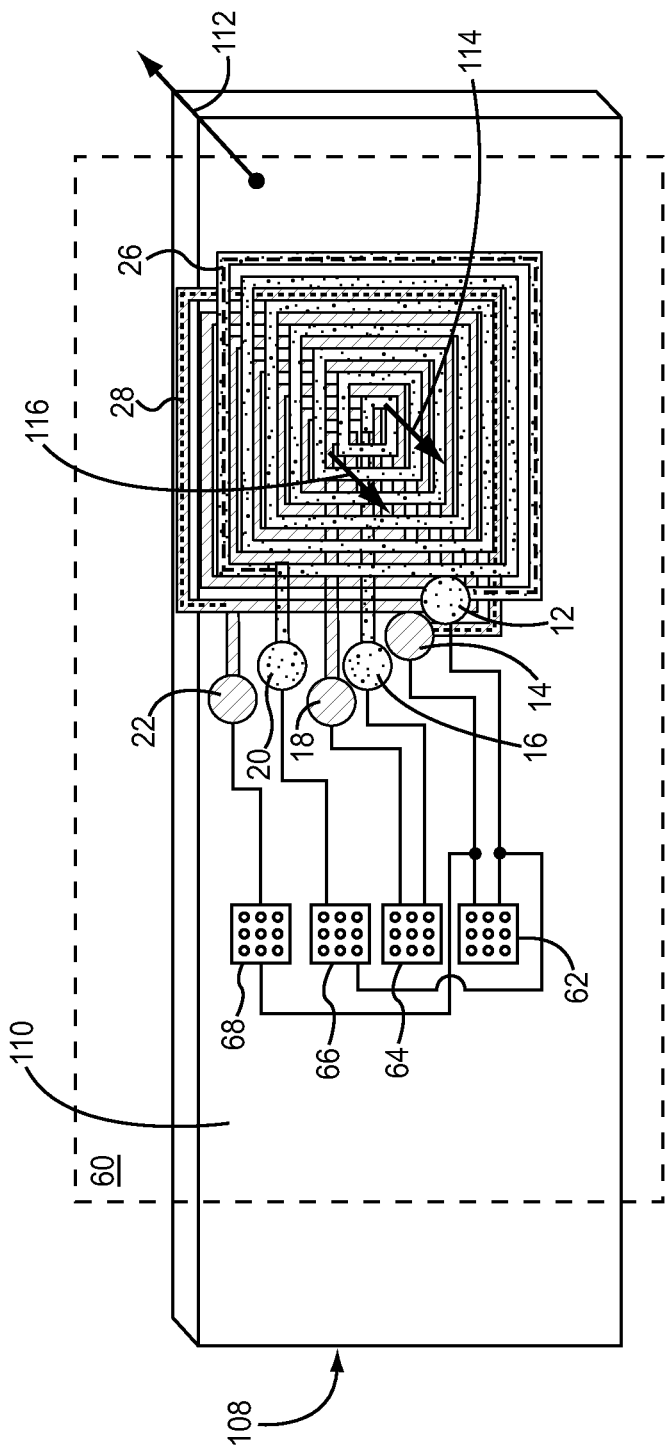
FIG. 9 illustrates another embodiment of the hybrid coupler shown in FIG. 5 provided in a Front End of Line (FEOL) of an IC package.

FIG. 9 illustrates another embodiment of the hybrid coupler 60 formed integrated within a semiconductor substrate 108. The semiconductor substrate 108 may be in a FEOL of an IC package. The semiconductor substrate 108 may be formed from a wafer and/or doped layers of a suitable semiconductor material. For example, the semiconductor material may be Silicon (Si), Silicon Germanium (SiGe), Gallium Arsenide (GaAs), Indium Phosphorus (InP), and/or the like. Typical dopants that may be utilized to dope the semiconductor layers are Gallium (Ga), Arsenic (As), Silicon (Si), Tellurium (Te), Zinc (Zn), Sulfur (S), Boron (B), Phosphorus (P), Aluminum Gallium Arsenide (AlGaAs), Indium Gallium Arsenide (InGaAs), and/or the like. Furthermore, metallic layers, conductive vias, insulating layers, and the like may be formed on one or more surfaces or within the semiconductor substrate 108 to provide terminals, traces, coils, connections, passive impedance elements, active semiconductor components, and/or the like. The hybrid coupler 60 is formed with the metallic layers, conductive vias, and/or insulating layers integrated into the semiconductor substrate 108. Also, any type of suitable semiconductor technology may be used to provide the topology of the semiconductor substrate 108. For example, the semiconductor technology may be Complementary Metal-On-Oxide Semiconductor technology (CMOS), BiComplementary Metal-On-Oxide Semiconductor technology (BiCMOS), Silicon-On-Insulator technology (SOI), and/or the like. In this embodiment, the semiconductor technology of the semiconductor substrate 108 is SOI, and thus the semiconductor material is Silicon (Si).

Additionally, the semiconductor substrate 108 has a surface 110. The surface 110 thus defines a direction 112 normal to the surface 110. Terms in this disclosure referring to directional words such as "over" or "top" and "under" or "beneath" are made with respect to the direction 112 defined by the surface 110 of the semiconductor substrate 108. As shown in FIG. 9, the first port 12, the second port 14, the third port 16, the fourth port 18, the fifth port 20, and the sixth port 22 are each formed as a terminal on the surface 110 of the semiconductor substrate 108. In this manner, the RF signal 24, the first RF QHS 30, and the second RF QHS 32 may be input and/or output from the hybrid coupler 60 as described above. The first inductive element 26 is formed as a spiral coil on the surface 110. The first inductive element 26 and the first port 12, the second port 14, the third port 16, the fourth port 18, the fifth port 20, and the sixth port 22 may be formed from a metallic layer on the surface 110 that has been etched to provide the first inductive element 26 and the first port 12, the second port 14, the third port 16, the fourth port 18, the fifth port 20, and the sixth port 22. At a center of the spiral coil, the first inductive element 26 shown in FIG. 8B defines a central axis 114 approximately parallel to the direction 112, and thus normal to the surface 110. The first inductive element 26 is wound about the central axis 114 to form turns that have increasing circumferences the more outward the turns are from the central axis 114.

Additionally, the second inductive element 28 is formed as a spiral coil within the semiconductor substrate 108. The second inductive element 28 may be formed from a metallic layer within the semiconductor substrate 108. The metallic layer may be formed on a layer beneath the surface 110 and etched to provide the second inductive element 28. At a center of the spiral coil, the second inductive element 28 shown in FIG. 8B defines a central axis 116 approximately parallel to the direction 112, and thus normal to the surface 110. The second inductive element 28 is wound about the central axis 116 to form turns that have increasing circumferences the more outward the turns are from the central axis 116. The first inductive element 26 and the second inductive element 28 are inductively coupled so that the magnetic flux of each one of the inductive elements 26, 28 induces a current in the other one of the inductive elements 28, 26.

FIG. 9 also illustrates the first variable capacitive element 62, the second variable capacitive element 64, the third variable capacitive element 66, and the fourth variable capacitive element 68. Each of the variable capacitive elements 62, 64, 66, and 68 is formed as a programmable capacitor array (PCA) in the semiconductor substrate 108. However, with the arrangement shown in FIG. 9, the first inductive element 26 and the second inductive element 28 are configured so that there is a parasitic capacitance between the first inductive element 26 and the second inductive element 28. In this embodiment, the parasitic capacitance between the first inductive element 26 and the second inductive element 28 is significantly greater than a highest capacitive value of the variable capacitances provided by the variable capacitive elements 62, 64, 66, and 68. As such, the largest and greatest capacitive impedance is from this parasitic capacitance between the inductive elements 26, 28. Also, the parasitic capacitance sets a minimum capacitance between the first inductive element 26 and the second inductive element 28. While the third variable capacitance of the third variable capacitive element 66 can be used to adjust a capacitive impedance as seen between the first port 12 and the second port 14, and the fourth variable capacitance of the fourth variable capacitive element 68 can be used to adjust a capacitive impedance as seen between the third port 16 and the fourth port 18, the primary capacitive impedance between the first port 12 and the second port 14, and between the third port 16 and the fourth port 18, is from the parasitic capacitance between the first inductive element 26 and the second inductive element 28.

As such, the parasitic capacitance between the first inductive element 26 and the second inductive element 28 sets a minimum capacitance of the hybrid coupler 60. Note that in this embodiment, there is a displacement along the surface 110 from the central axis 114 of the first inductive element 26 to the central axis 116 of the second inductive element 28. Since the first inductive element 26 and the second inductive element 28 are approximately parallel, this displacement sets the parasitic capacitance and the minimum capacitance of the hybrid coupler 60. Accordingly, when manufacturing the hybrid coupler 60, this displacement may be selected to set the parasitic capacitance in accordance with a frequency range of the different RF communication bands for a particular design application. During operation, adjustments can be made to the variable capacitances of the variable capacitive elements 62, 64, 66, and 68 so as to tune the hybrid coupler 60 to a selected one of the different RF communication bands.

Those skilled in the art will recognize improvements and modifications to the preferred embodiments of the present disclosure. All such improvements and modifications are considered within the scope of the concepts disclosed herein and the claims that follow.

What is claimed is:

1. A hybrid coupler comprising:
    a first port, a second port, a third port, and a fourth port;
    a first inductive element that is connected from the first port to the third port;
    a second inductive element that is connected from the second port to the fourth port, wherein the second inductive element is mutually coupled to the first inductive element;
    a first capacitive element that is coupled from a first intermediary node of the first inductive element to either the first port or the third port; and
    a second capacitive element that is coupled from a second intermediary node of the second inductive element to either the second port or the fourth port.

2. The hybrid coupler of claim 1 wherein the first inductive element has a first inductance and the second inductive element has a second inductance, and wherein the first inductance is the same as the second inductance.

3. The hybrid coupler of claim 2 wherein the first capacitive element has a first capacitance and the second capacitive element has a second capacitance, and wherein the first capacitance is the same as the second capacitance.

4. The hybrid coupler of claim 1 wherein the first inductive element is mutually coupled to the second inductive element such that a radio frequency (RF) signal received at the first port is split into a first RF quadrature hybrid signal output from the second port and a second RF quadrature hybrid signal output from the third port.

5. The hybrid coupler of claim 1 wherein:
    the first capacitive element comprises a first variable capacitive element having a first variable capacitance; and
    the second capacitive element comprises a second variable capacitive element having a second variable capacitance.

6. The hybrid coupler of claim 5 further comprising:
    a third variable capacitive element having a third variable capacitance, wherein the third variable capacitive element is connected between the first port and the second port; and
    a fourth variable capacitive element having a fourth variable capacitance, wherein the fourth variable capacitive element is connected between the third port and the fourth port.

7. The hybrid coupler of claim 6 wherein:
    the first variable capacitive element is connected between the first intermediary node and the first port; and
    the second variable capacitive element is connected between the second intermediary node and the second port.

8. The hybrid coupler of claim 6 wherein:
    the first variable capacitive element is connected between the first intermediary node and the third port; and
    the second variable capacitive element is connected between the second intermediary node and the fourth port.

9. The hybrid coupler of claim 1 wherein the first capacitive element has a first capacitance and the second capacitive element has a second capacitance, and wherein the hybrid coupler further comprises:
    a third capacitive element having a third capacitance, wherein the third capacitive element is connected between the first port and the second port; and
    a fourth capacitive element having a fourth capacitance, wherein the fourth capacitive element is connected between the third port and the fourth port.

10. The hybrid coupler of claim 1 wherein:
    the first capacitive element is connected between the first intermediary node and the first port; and
    the second capacitive element is connected between the second intermediary node and the second port.

11. The hybrid coupler of claim 10 further comprising:
    a fifth port, wherein the fifth port is connected to the first intermediary node and the first capacitive element is connected from the first port to the fifth port; and a sixth port, wherein the sixth port is connected to the second intermediary node and the second capacitive element is connected from the second port to the sixth port.

12. The hybrid coupler of claim 1 wherein:
the first capacitive element is connected between the first intermediary node and the third port; and
the second capacitive element is connected between the second intermediary node and the fourth port.

13. The hybrid coupler of claim 12 further comprising:
a fifth port, wherein the fifth port is connected to the first intermediary node and the first capacitive element is connected from the third port to the fifth port; and
a sixth port, wherein the sixth port is connected to the second intermediary node and the second capacitive element is connected from the fourth port to the sixth port.

14. The hybrid coupler of claim 1 wherein the hybrid coupler is integrated into a substrate.

15. The hybrid coupler of claim 14 wherein the substrate is formed from an insulating material.

16. The hybrid coupler of claim 14 wherein the substrate is formed from a semiconductor material.

17. An integrated circuit (IC) package comprising:
a substrate; and
a hybrid coupler integrated into the substrate, wherein the hybrid coupler comprises:
 a first port, a second port, a third port, and a fourth port;
 a first inductive element that is connected from the first port to the third port;
 a second inductive element that is connected from the second port to the fourth port, wherein the second inductive element is mutually coupled to the first inductive element;
 a first capacitive element that is coupled from a first intermediary node of the first inductive element to either the first port or the third port; and
 a second capacitive element that is coupled from a second intermediary node of the second inductive element to either the second port or the fourth port.

18. The IC package of claim 17 further comprising:
a Back End of Line (BEOL) having the substrate and the hybrid coupler, wherein the substrate is an insulating substrate; and
a Front End of Line (FEOL) having a semiconductor substrate.

19. The IC package of claim 17 further comprising:
a Back End of Line (BEOL) having an insulating substrate; and
a Front End of Line (FEOL) having the substrate and the hybrid coupler, wherein the substrate is a semiconductor substrate.

20. The IC package of claim 17 further comprising:
a first metallic layer on a surface of the substrate, wherein the first metallic layer forms the first inductive element as a first spiral coil; and
a second metallic layer within the substrate, wherein the second metallic layer forms the second inductive element as a second spiral coil.

* * * * *